(12) United States Patent
Nagata et al.

(10) Patent No.: US 8,350,601 B2
(45) Date of Patent: Jan. 8, 2013

(54) DEVICE FOR DRIVING SWITCHING ELEMENTS

(75) Inventors: Junichi Nagata, Okazaki (JP); Tsuneo Maebara, Nagoya (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 12/961,836

(22) Filed: Dec. 7, 2010

(65) Prior Publication Data

US 2011/0133790 A1   Jun. 9, 2011

(30) Foreign Application Priority Data

Dec. 7, 2009   (JP) ................................. 2009-277517

(51) Int. Cl.
  *H03B 1/00* (2006.01)
(52) U.S. Cl. ........................................ 327/109; 327/108
(58) Field of Classification Search ........................ None
  See application file for complete search history.

(56) References Cited

U.S. PATENT DOCUMENTS 5,929,665 A   7/1999   Ichikawa et al.
8,102,687 B2 *   1/2012   Takasu et al. ................. 363/132
2009/0066402 A1 *   3/2009   Hiyama ......................... 327/392

FOREIGN PATENT DOCUMENTS

| JP | 10-304650 | 11/1998 |
|----|-----------|---------|
| JP | 3743168 | 11/2005 |
| JP | 2009-071956 | 4/2009 |

* cited by examiner

*Primary Examiner* — Cassandra Cox
(74) *Attorney, Agent, or Firm* — Nixon & Vanderhye P.C.

(57) ABSTRACT

A drive unit controls the operation of a corresponding power switching element such as IGBT which forms an inverter and a converter. The drive unit controls the operation of the corresponding power switching element to supply an operation current to a motor generator. First and second switching elements in the drive unit are simultaneously turned on when an operation signal transferred from a control device is switched to a turning-on instruction operation signal. The voltage at the gate terminal of the power switching element is shifted to a divided voltage obtained by dividing a voltage of the power source by first and second resistances connected in series in the drive unit. When a mirror time period of the power switching element is elapsed, the second switching element only is turned off in order to shift the gate voltage of the power switching element to the voltage of the power source.

23 Claims, 13 Drawing Sheets

(CASE 1)

(CASE 2)

(CASE 1)

(CASE 2)

DEVICE FOR DRIVING SWITCHING ELEMENTS

CROSS-REFERENCE TO RELATED APPLICATION

This application is related to and claims priority from Japanese Patent Application No. 2009-277517 filed on Dec. 7, 2009, the contents of which are hereby incorporated by reference.

BACKGROUND OF THE INVENTION

1. Field of the Invention

The present invention relates to drive devices for driving switching elements of a voltage controlled type. For example, such switching elements are power switching elements used in an inverter and a convertor which are placed between a motor generator and a high-voltage power source mounted on vehicles such as hybrid vehicles.

2. Description of the Related Art

There is a conventional drive device for driving a switching element such as a power switching element. The power switching element is used in an inverter or a converter placed between a motor generator and a high-voltage power source mounted on a hybrid vehicle.

For example, a conventional document, Japanese patent laid open publication No. JP 2009-71956 discloses such a drive device equipped with a pair of power sources, a high voltage power source and a low voltage power source. The power sources supply a different voltage to the gate terminal of a switching element such as a gate bipolar transistor (IGBT) in order to turn on the IGBT. An inverter and a converter are equipped with a plurality of IGBTs. In order to turn on the IGBT, one of the power sources supplies a low voltage to the gate terminal of the IGBT.

Next, the other power source supplies a high voltage to the gate terminal of the IGBT in order to increase the voltage potential of the gate terminal of the IGBT. This makes it possible to efficiently avoid an excess current from generating and flowing in the IGBT. Further, this makes it possible to decrease a conductive loss because of rapidly increasing the voltage of the gate terminal of the IGBT when there is no possibility to flow such an excess current in the IGBT.

However, the conventional drive device having the structure described above has a drawback where a current flows from a high voltage side to a low voltage side when the high voltage power source supplies power to the gate terminal of the IGBT. In order to solve this problem, the conventional drive device is equipped with a diode to inhibit such a current from flowing. However, the above conventional solution using the diode would cause a problem for the voltage of the gate terminal of the IGBT to fluctuate.

Because the above conventional drive device is equipped with the pair of the power sources such as a high voltage power source and a low voltage power source, the entire circuit size of the drive device is increased, and the manufacturing cost thereof is also increased.

SUMMARY OF THE INVENTION

It is an object of the present invention to provide a drive device for driving a switching element of a voltage controlled type. The switching element is capable of switching a voltage to be supplied to a conductive control terminal (namely, the gate terminal) of the switching element such as a power switching element. The drive device according to the present invention has a first path and a second path. The first path has a passive element and a first opening/closing means where the conductive control terminal of the switching element of a voltage controlled type is connected to a high voltage power source. The second path has a passive element and a second opening/closing means where the conductive control terminal of the switching element of a voltage controlled type is connected to a low voltage power source. The drive device controls the first opening/closing means and the second opening/closing means to drive the switching elements.

To achieve the above purposes, the present invention provides a drive device for driving a switching element of a voltage controlled type. The drive device has a first path, a second path, and a switching means. The first path is comprised of a passive element and a first opening/closing means. The first path connects a conductive control terminal of the switching element to a high voltage supply means. The first path also disconnects the conductive control terminal of the switching element from the high voltage supply means. The second path is comprised of a passive element and a second opening/closing means. The second path connects the conductive control terminal of the switching element to a low voltage supply means. The switching means switches a first state to a second state of the first opening/closing means and the second opening/closing means in order to switch a switching state of the switching element. The first state indicates that both the first opening/closing means and the second opening/closing means are simultaneously turned on, and the second state indicates that one of the first opening/closing means and the second opening/closing means is turned on and the other opening/closing means is turned off. In particular, one of the first opening/closing means and the second opening/closing means is capable of connecting one of the high voltage supply means and the second voltage power source to the conductive control terminal of the switching element in order to supply a voltage to the conductive control terminal of the switching element so that the switching element enters the switching state indicated by the switching means.

This configuration of the drive device according to the present invention makes it possible to change the voltage to be supplied to the conductive control terminal of the switching element. It is thereby possible to supply a difference voltage to the conductive control terminal of the switching element under the control of the switching means.

In the drive device as another aspect of the present invention, a converged voltage at the conductive control terminal of the switching element when both the first opening/closing means and the second opening/closing means enter the turned-on state is shifted toward a voltage side supplied from the high voltage supply means or the low voltage supply means rather than a mirror voltage of the switching element during a mirror time period of the switching element so that the switching element enters the switching state indicated by the switching means.

This makes it possible for the drive device to supply a different voltage to the conductive control terminal of the switching element before and after the mirror time period of the switching element when the switching means switches the switching state of the switching element.

In the drive device as another aspect of the present invention, the switching means performs the switching operation when the switching state of the switching element is switched from the turned-off state to the turned-on state, and the converged voltage of the conductive control terminal of the switching element when both the first opening/closing means and the second opening/closing means are turned off is shifted toward a voltage when the switching element is turned on rather than the mirror voltage of the switching element during a mirror time period of the switching element.

This makes it possible for the drive device to supply a different voltage to the conductive control terminal of the switching element before and after the mirror time period of the switching element when the switching means switches the switching state of the switching element to the turned-on state.

In the drive device as another aspect of the present invention, the switching means performs the switching operation of the switching element after completion of the mirror time period of the switching element.

The drive device as another aspect of the present invention further has a delay signal generating means. The delay signal generating means generates a delay signal which indicates a delay time which is delayed from the time for switching the switching state of the switching element indicated by an operation signal. The switching means performs the switching operation to switch the switching state of the switching element on the basis of the delay signal.

It is thereby possible for the switching means to efficiently perform the switching operation of the switching element at the optimum timing.

In the drive device as another aspect of the present invention, the delay signal generating means receives the operation signal, and generates the delay signal on the basis of the received operation signal.

It is thereby possible for the delay signal generating means to correctly generate the delay signal.

In the drive device as another aspect of the present invention, the switching means switches the condition of the first opening/closing means and the second opening/closing means from the first state to the second state in order to switch the switching state of the switching element from the turned-off state to the turned-on state. The first state indicates that both the first opening/closing means and the second opening/closing means are simultaneously turned on, and the second state indicates that the first opening/closing means is turned on, and the second switching means is turned off.

The drive device further has an excess current detection means for detecting whether or not an excess current flowing in the switching element is excessively increased. The delay signal indicates the delay time when the switching element is switched to the turned-on state. A delay time period until the delay time indicated by the delay signal is not less than a time period which is necessary for the excess current detection means to detect the excess current flowing in the switching element.

An excess current flows in the switching element when the switching element is turned on if an output terminal of the switching element is connected to a circuit member having a low voltage level with a very low impedance. However, it is necessary to have some time period until the excess current detection means detects such an excess current. When the switching means switches the condition of the first opening/closing means and the second opening/closing means into the second state where the first opening/closing means is turned on and the second opening/closing means is turned off before the excess current detection means detects the occurrence of an excess current and the current flowing in the switching element is then increased. This has a possibility of decreasing the reliance in operation of the switching element. In order to avoid such a drawback, the drive device according to the present invention uses the delay time period of the delay signal previously described.

The drive device as another aspect of the present invention further has an inhibition means. The inhibition means inhibits the switching operation of the switching means when the excess current detection means detects the occurrence of an excess current flowing in the switching element.

It is therefore possible to avoid the current flowing in the switching element from further increasing because the inhibition means inhibits the switching means from performing the switching operation when the excess current detection means detects the occurrence of an excess current flowing in the switching element.

In the drive device as another aspect of the present invention, the delay signal indicates the delay time when the switching element is switched to the turned-on state, and a predicted time period is used as the delay time until the delay time, where the predicted time period is a time period counted from the time when the switching means instructs the switching element to be turned on to the time before the completion of the mirror time period of the switching element.

This makes it possible to decrease the power loss (or conductive power loss) of the switching element.

In the drive device as another aspect of the present invention, the delay signal indicates the delay time at which the switching element is switched to the turned-on state. A predicted time period is used as the delay time period until the delay time. This predicted time period is a time period counted from the time when the switching element is switched to the turned-on state to the timing when the mirror time period of the switching element is completed.

When the change of the current flowing in the switching element is large, a large surge voltage is often generated because of being an inductance (parasitic inductance, etc.) in the path through which the current flows. It is generally preferred to suppress the change speed of the voltage at the conductive control terminal of the switching element from being increased in order to decrease such a surge voltage. However, when the change of the voltage at the conductive control terminal of the switching element is small, the power loss (or conductive power loss) of the switching element is increased when the switching state of the switching element is switched. From this viewpoint, the drive device according to the present invention makes it possible to decrease the power loss as low as possible while suppressing such a surge voltage from generating because the switching means performs the switching operation of the switching element after completion of the mirror time period.

In the drive device as another aspect of the present invention, the switching means further has a completion detection means. The completion detection means detects the completion timing when the mirror time period of the switching element is completed. The switching means performs the switching operation when the completion detection means detects the completion timing of the mirror time period of the switching element.

When the current flowing in the switching element is greatly changed, a large surge voltage is often generated by an inductance (parasitic inductance, etc.) in the path through which the current flows. It is generally preferred to suppress the change of the voltage at the conductive control terminal of the switching element from being increased in order to decrease such a surge voltage. However, when the voltage change at the conductive control terminal of the switching element is small, the power loss (or conductive power loss) of the switching element is increased when the switching state of the switching element is switched. From this viewpoint, the drive device according to the present invention makes it possible to decrease the power loss to as low as possible while suppressing surge voltage from generating because the switching means performs the switching operation of the switching element when the completion detection means detects the completion of the mirror time period.

In the drive device as another aspect of the present invention, the switching means further has a completion detection means. The completion detection means detects the completion of the mirror time period of the switching element. The switching means performs the switching operation when the delay time period until the delay time indicated by the delay signal is elapsed and the completion detection means detects the completion of the mirror time period of the switching element.

When the current flowing in the switching element is greatly changed, a large surge voltage is often generated by an inductance (parasitic inductance, etc.) in the path through which the current flows. It is generally preferred to suppress the change of the voltage at the conductive control terminal of the switching element from being increased in order to decrease such a surge voltage. However, when the voltage change at the conductive control terminal of the switching element is small, the power loss (or conductive power loss) of the switching element is increased when the switching state of the switching element is switched. From this point of view, the drive device according to the present invention makes it possible to decrease the power loss as low as possible while suppressing surge voltage from generating because the switching means performs the switching operation of the switching element when the delay time period until the delay time indicated by the delay signal is elapsed, and the completion detection means detects the completion of the mirror time period.

In the drive device as another aspect of the present invention, the completion detection means has a comparison means. The comparison means compares the voltage of the conductive control terminal of the switching element with a completion detection voltage. The switching means uses the comparison result output from the comparison means as the detection result which indicates the completion of the mirror time period of the switching element.

The drive device as another aspect of the present invention further has a temperature detection means for detecting a temperature of the switching element. The completion detection means adjusts the completion detection voltage on the basis of the temperature detected by the temperature detection means.

The voltage at the conductive control terminal of the switching element has temperature dependent characteristics. That is, the voltage of the conductive control terminal of the switching element is changed according to the change in temperature of the switching element. The drive device according to the present invention determines, as a final stable voltage, the voltage at the conductive control terminal of the switching element on the basis of the predicted value at the mirror time period according to the current temperature of the switching element detected by the temperature detection means.

In the drive device as another aspect of the present invention, the completion detection means comprises a voltage-change detection means for detecting a change of the voltage at the conductive control terminal of the switching element, and detects the completion of the mirror time period on the basis of the voltage change detected by the voltage-change detection means.

The change speed of the voltage at the conductive control terminal of the switching element is greatly decreased during the mirror time period. Accordingly, the change speed of the voltage at the conductive control terminal of the switching element is greatly increased when the mirror time period is completed. The completion detection means detects the completion of the mirror time period of the switching element on the basis of the change of the voltage at the conductive control terminal of the switching element.

In the drive device as another aspect of the present invention, the passive element in the first path has a resistance.

In the drive device as another aspect of the present invention, the passive element in the second path has a resistance.

In the drive device as another aspect of the present invention, the passive element in the first path is composed of a resistance, and the passive element in the second path is composed of a resistance.

Using the resistance in the first path and/or the second path makes it possible to form the first path and/or the second path with a simple configuration. This makes it possible to decrease the entire size of the drive device, and to decrease the manufacturing cost of the drive device.

In the drive device as another aspect of the present invention, the passive element in the first path is composed of a resistance, and the passive element in the second path is composed of a resistance and a capacitance which are connected in parallel with each other.

According to the configuration of the drive device, when the switching means switches the condition of the switching element from the turned-off state to the turned-on state by connecting the high voltage supply means to the conductive control terminal of the switching element, the change speed of the voltage at the conductive control terminal of the switching element is limited by the capacitance when both the first opening/closing means and the second opening/closing means are turned on. It is thereby possible to decrease the resistance value of the resistance in the first path. Still further, it is possible to greatly increase the rising speed of the voltage at the conductive control terminal of the switching element as large as possible when the switching means switches the condition of the first opening/closing means and the second opening/closing means to the second state. The second state indicates that the first opening/closing means is turned on and the second opening/closing means is turned off.

In the drive device as another aspect of the present invention, the passive element in the first path is composed of a resistance and a capacitance which are connected in parallel with each other. The passive element in the second path is composed of a resistance and a capacitance which are connected in parallel with each other.

In the drive device as another aspect of the present invention, the switching element is turned on when the high voltage supply means is connected to the conductive control terminal of the switching element. The switching means performs the switching operation when the switching state of the switching element is switched from the turned-off state to the turned-on state. A divided voltage of the voltage between the high voltage supply means and the low voltage supply means is lower than the mirror voltage of the switching element. This divided voltage is obtained by the capacitance in the first path and the capacitance in the second path connected in series.

A divided voltage of the voltage between the high voltage supply means and the low voltage supply means is higher than the mirror voltage of the switching element. This divided voltage is obtained by the resistance in the first path and the resistance in the second path connected in series This makes it possible to decrease the time period until the conductive control terminal of the switching element becomes the mirror voltage of the switching element.

In the drive device as another aspect of the present invention, the switching element performs the switching operation when the switching state of the switching means is switched from the turned-on state to the turned-off state. When the first opening/closing means and the second opening/closing means are turned on, the converged voltage at the conductive control terminal of the switching element is shifted toward the voltage which is obtained when the switching element is turned off rather than the mirror voltage of the switching element.

This makes it possible to supply a different voltage to the conductive control terminal of the switching element before and after the mirror time period when the switching state of the switching element is switched to the turned-off state.

In the drive device as another aspect of the present invention, the switching means performs the switching operation after completion of the mirror time period of the switching element.

In the drive device as another aspect of the present invention, the switching element to be driven by the drive device forms a switching element in a power conversion circuit in which a switching element in a high voltage side and a switching element in a low voltage side are connected in series.

In case where the drive device according to the present invention is used in a power conversion circuit, when a switching element at a high voltage side and a switching element at a low voltage side are simultaneously turned on, there is a possibility of an excess current flowing in these switching elements. It is possible for the drive device according to the present invention to limit the amount of current flowing in these switching elements when the first opening/closing means and the second opening/closing means are simultaneously turned on.

BRIEF DESCRIPTION OF THE DRAWINGS

A preferred, non-limiting embodiment of the present invention will be described by way of example with reference to the accompanying drawings, in which.

DETAILED DESCRIPTION OF THE PREFERRED EMBODIMENTS

Figure 1:
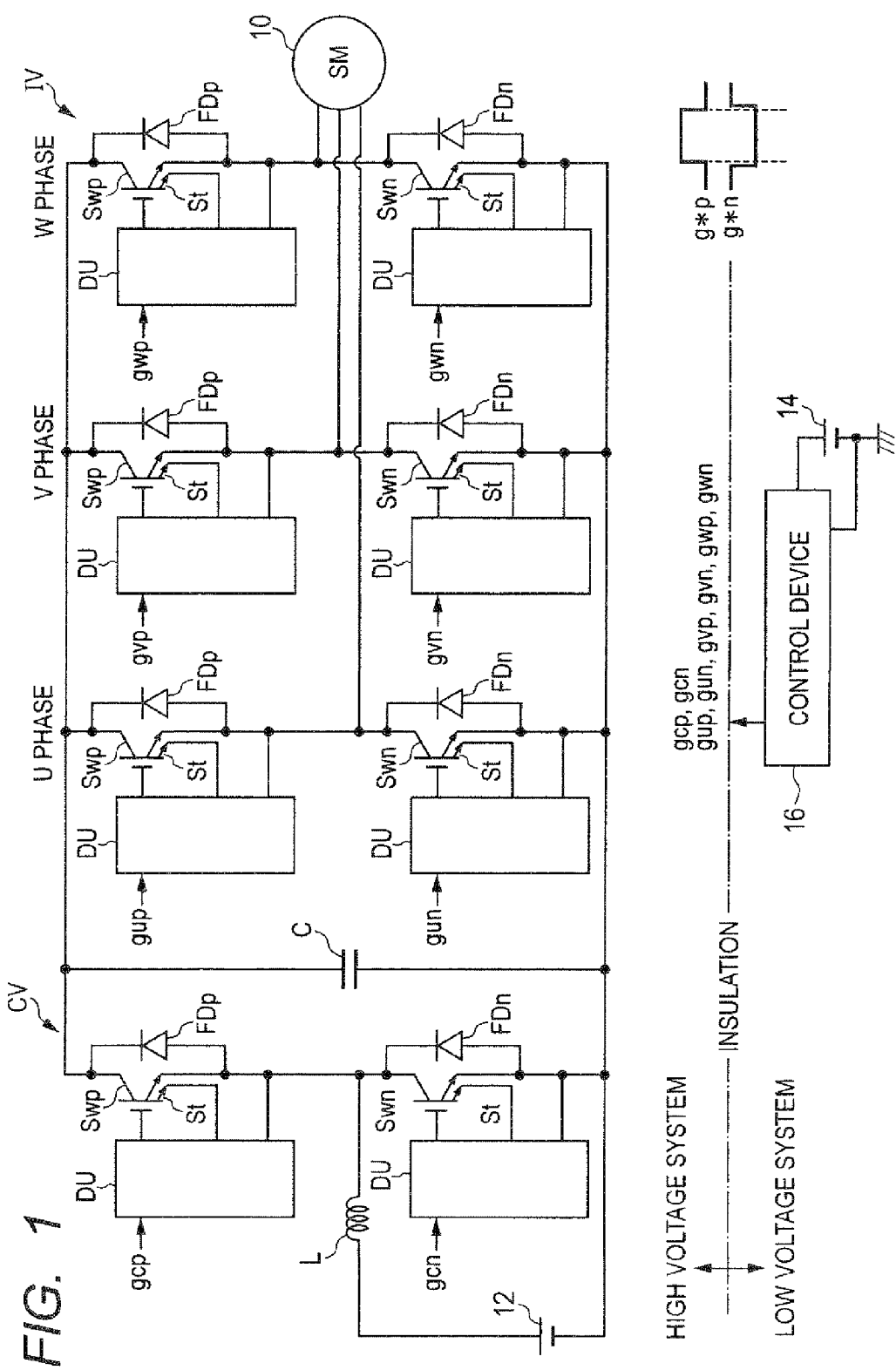
FIG. 1 is a view showing a configuration of a system which is comprised of a motor generator, a converter and an inverter equipped with drive units DU as drive devices, a high voltage power source, power switching elements, and a control device.

Hereinafter, various embodiments of the present invention will be described with reference to the accompanying drawings. In the following description of the various embodiments, like reference characters or numerals designate like or equivalent component parts throughout the several diagrams.

First Embodiment

A description will be given of a drive device for driving a power switching element according to the first embodiment of the present invention with reference to FIG. 1 to FIG. 4A and FIG. 4B. The first embodiment applies the drive unit DU as the drive device according to the first embodiment to a hybrid vehicle.

FIG. 1 is a view showing a configuration of a system composed mainly of a motor generator 10 as an on-vehicle main device, a converter CV, an inverter IV, drive units DU as drive devices, a high voltage battery 12, and a control device 16.

In particular, the motor generator 10 is connected to the high voltage battery 12 through the inverter IV and the converter CV.

The inverter IV has three group of the power switching elements Sw (Swp, Swn). The three group in the inverter IV are connected in parallel with each other. Each of the three group in the inverter IV is composed of the power switching element Swp and the power switching element Swn connected in series. The power switching element Swp is placed at a high voltage side and the power switching element Swn is placed at a low voltage side.

A connection node between the power switching element Swp at a high voltage side and the power switching element Swn at a low voltage side in each of the three group is electrically connected to each of three phases of the motor generator 10. That is, the three connection nodes of the three groups are electrically connected to the phases of the motor generator 10, respectively.

Each of the power switching elements Sw (Swp, Swn) is an element of a voltage controlled type. The control device 16 transfers various types of operation signals to the drive units DU as drive devices according to embodiments of the present invention. Each of the drive units DU controls the operation of the corresponding power switching element Sw (Swp, Swn) on the basis of the received operation signal transferred from the control device 16.

The converter CV is equipped with a capacitance C, a group of a power switching element Swp at a high voltage side and a power switching element Swn at a low voltage side connected in series, and a reactor L. The connection node between the power switching elements Swp and Swn connected in series is connected to the high voltage battery 12 through the reactor L.

The anode and cathode of a freewheel diode FDp at a high voltage side are connected to the input and output (collector and emitter) terminals of the power switching element Swp at a high voltage side, respectively.

The anode and the cathode of a freewheel diode FDn at a low voltage side are connected to the input and output (collector, emitter) terminals of the power switching element Swn at a low voltage side, respectively.

In the configuration of the drive unit as the drive device according to the first embodiment shown in FIG. 1, in particular, the power switching element Swp at a high voltage side and the freewheel diode FDp at a high voltage side are adjacent to each other on a same semiconductor substrate, and the power switching element Swn at a low voltage side and the freewheel diode FDn at a low voltage side are adjacent to each other on the same semiconductor substrate.

The drive unit DU is connected to the conductive control terminal of each of the power switching element Swp and the power switching element Swn which form the inverter IV. The power switching elements Swp and Swn are driven by the drive units DU on the basis of the operation signals transferred from the control device 16 equipped with a low voltage battery 14.

The control device 16 generates the operation signals gup, gyp, and gwp, and the operation signals gun, gvn, and gwn on the basis of detection values of various types of sensors (not shown). The power switching elements Swp in U phase, V phase, and W phase of the inverter IV are driven by the drive units DU on the basis of the operation signals gup, gyp, and gwp, respectively. As in the case for the power switching elements Swp, the power switching elements Swn in U phase, V phase, and W phase of the inverter IV are driven by the drive units DU on the basis of the operation signals gun, gvn, and gwn, respectively.

Further, as in the case for the inverter IV, the control device 16 generates and outputs these operation signals gcp and gcn in order to drive the power switching elements Swp and Swn in the converter CV. The power switching element Swp and the power switching element Swn in the converter CV are driven by the operation signals gcp and gcn transferred from the control device 12 through the drive units DU.

The high voltage system having the inverter IV, the converter CV, and the high voltage battery 16 is electrically insulated from the low voltage system having the control device 16 and the low voltage battery 14 through an insulation means such as an optical isolator or a photo coupler (omitted from drawings).

As previously described, the control device 16 in the low voltage system transfers the operation signals g (gcp, gcn, gup, gun, gvp, gvn, gwp, gwn, etc. shown in FIG. 1) to the inverter IV and the converter CV in the high voltage system through the insulation means such as the optical isolator.

Each of the power switching elements Swp and Swn is made of an insulated gate bipolar transistor (IGBT). Each of the power switching elements Swp and Swn has a sense terminal St through which a minute current which correlates with a current flowing between the input terminal and the output terminal of the power switching element Sw.

Figure 2:
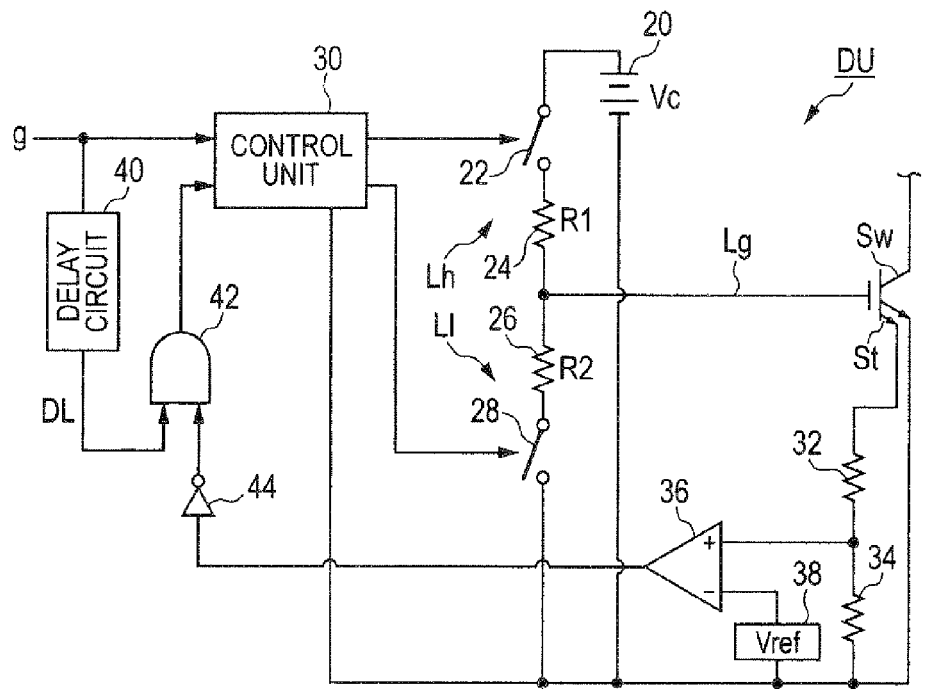
FIG. 2 is a view showing a circuit configuration of the drive unit DU as the drive device according to the first embodiment shown in FIG. 1.

FIG. 2 is a view showing a circuit configuration of the drive unit DU (drive device) according to the first embodiment shown in FIG. 1.

As shown in FIG. 2, the drive unit DU is composed mainly of a power source 20, a control unit 30, a delay circuit 40, resistances R1, R2, 32, and 34, a comparator 36, switching element 22 and 28, and other components.

In the following description, the power switching elements Swp and Swn to be controlled will also be referred to as the "power switching element SW", and the freewheel diodes FDp and FDn will also be referred to as the "freewheel diode FD", and the operation signals gup, gvp, gwp, gcp, gun, gvn, gwn, and gcn will be also referred to as the operation signal g for brevity.

As shown in FIG. 2, the drive unit DU has the power source 20 in order to supply a voltage to the power switching element Sw in order to turn on the power switching element Sw, where the voltage is higher than the voltage of the output terminal (emitter) of the power switching element Sw by a predetermined voltage Vc.

Although FIG. 2 shows the power source 20 as a battery, it is also possible to use a capacitance which forms a floating power source instead of the power source 20.

The power source 20 supplies a high voltage to the conductive control terminal (gate) of the power switching element Sw through a high voltage path Lh and a common path Lg. The high voltage path Lh is equipped with the first switching element 22 and the first resistance 24 as a linear element.

Further, electric charges at the gate of the power switching element Sw are discharged through the common path Lg and a low voltage path Ll. The low voltage path Ll is composed of the second switching element 28 and the second resistance 26 as a liner element.

The gate of the power switching element Sw is electrically connected to the emitter of the power switching element Sw through the common path Lg and the low voltage path Ll.

As shown in FIG. 2, the drive unit DU further has the control unit 30. The control unit 30 receives the operation signal g, and operates the first switching element 22 and the second switching element 28 based on the received operation signal g in order to drive the power switching element Sw.

In more detail, when the operation signal g is switched to a high voltage level as a turning-on operation instruction signal, both the first switching element 22 and the second switching element 28 are turned on. This makes it possible to charge the conductive control terminal of the power switching element Sw. After a predetermined delay time period is elapsed, the control unit 30 instructs the second switching element 28 to be turned off. It is thereby possible to increase the voltage to be supplied to the conductive control terminal (gate terminal) of the power switching element Sw on the way of switching from the turned-off state to the turned-on state. The predetermined delay time period is set by the delay circuit 40.

The delay circuit 40 inputs the operation signal g, and generates the delay signal DL on the basis of the operation signal g. When receiving the delay signal DL transferred from the delay circuit 40, the control unit 30 delays the timing by the predetermined delay time period in order to switch the power switching element Sw to the turned-on state.

Figure 3A:
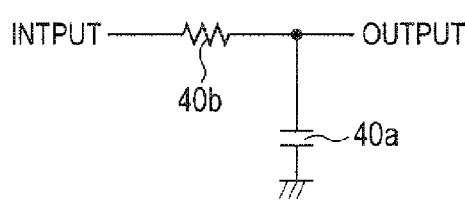
FIG. 3A is a view showing a circuit configuration of a delay circuit in the drive unit DU shown in FIG. 2.
Figure 3B:
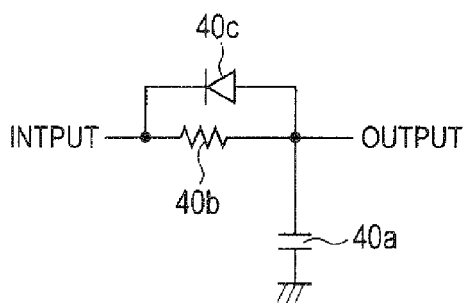
FIG. 3B is a view showing another circuit configuration of a delay circuit in the drive unit DU shown in FIG. 2.
Figure 3C:
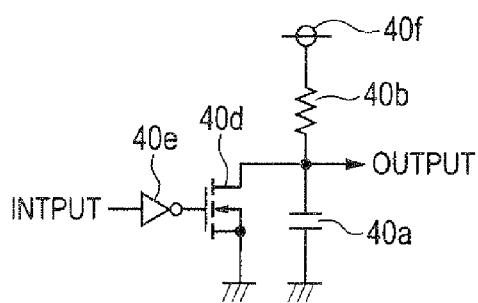
FIG. 3C is a view showing another circuit configuration of a delay circuit in the drive unit DU shown in FIG. 2.

FIG. 3A is a view showing a circuit configuration of the delay circuit 40 in the drive unit DU shown in FIG. 2. FIG. 3B is a view showing another circuit configuration of the delay circuit 40 in the drive unit DU shown in FIG. 2. FIG. 3C is a view showing another circuit configuration of the delay circuit 40 in the drive unit DU shown in FIG. 2. It is possible for the delay circuit 40 to have one of the circuit configurations shown in FIG. 3A, FIG. 3B, and FIG. 3C.

In the circuit configuration of the delay circuit 40 shown in FIG. 3A, when the operation signal g is changed to a high (H) level and the input terminal of the delay circuit 40 receives this operation signal g as an input signal, the voltage of the capacitance 40a is slightly increased. The output of the delay circuit 40 is shifted to the predetermined output voltage which corresponds to the voltage indicated by the operation signal g after a predetermined time period is elapsed.

In the configuration of the delay circuit 40 shown in FIG. 3B, a resistance 40b and a diode 40c are arranged in parallel. The diode 40c is placed in the forward direction from the input terminal side to the output terminal side of the delay circuit 40. This configuration shown in FIG. 3B makes it possible to delay the response time period from the time when the operation signal g is switched to the H level to the timing when the output signal of the delay circuit 40 is shifted to the H level. However, there is approximately no delay time from the time when the operation signal g is switched to the low (L) level to the timing when the output signal of the delay circuit 40 is shifted to the L level In the configuration of the delay circuit 40 shown in FIG. 3C, the switching element 40d is placed between the resistance 40b and the ground level. When the switching element 40d is turned on, the current does not flow through the capacitance 40a. That is, when receiving an inverse control signal output from the inverter 40e, the switching element 40d is turned on. This prevents the current from flowing through the capacitance 40a. This configuration of the delay circuit 40 shown in FIG. 3C makes it possible to delay the response time from the time when the operation signal g is changed to the H level to the timing when the output signal of the delay circuit 40 is changed to the H level. However, there is approximately no delay time from the time when the operation signal g is changed to the L level to the timing when the output signal of the delay circuit 40 is changed to the L level.

In the circuit configuration of the delay circuit 40 shown in FIG. 3C, the delay time period of the delay circuit 40 can be set so that the delay time period becomes a value which is longer than the time period until completion of the mirror time period of the power switching element Sw at which the rising speed of the gate voltage is drastically decreased during the shifting period from the turned-off state to the turned-on state of the switching element such as the switching elements 22 and 28.

In the drive unit DU according to the first embodiment, the second switching element 28 is not turned off when an excess current flows in the power switching element Sw even if the delay time period is elapsed. This control operation can be realized by the following circuit configuration.

In the circuit configuration of the drive unit DU shown in FIG. 2, the resistance 32 and the resistance 33 connected in series are arranged between the sense terminal St and the emitter of the power switching element Sw.

The connection node between the resistances 32 and 33 is connected to a non-inverse input terminal of the comparator 36. Further, the inverse input terminal of the comparator 36 is connected to the terminal of the reference power source 38 which supplies a reference voltage Vref.

The reference voltage Vref is set on the basis of the lower limit value (threshold value) which indicates the occurrence of an excess current which flows through the power switching element Sw. This makes it possible for the comparator 36 to detect whether the current flowing through the power switching element Sw is not less than/or less than the threshold current on the basis of the voltage drop at the resistances 32 and 34 through which the output current of the sense terminal St flows.

The output signal of the comparator 36 is inverted by the inverter 44, and the inverted output signal is supplied to the AND circuit 42.

The AND circuit 42 performs a logical product between the delay signal DL transferred from the delay circuit 40 and the output signal transferred from the inverter 44, and outputs the output signal as the result of the logical product to the control unit 30.

The control unit 30 instructs the second switching element 28 to be turned off when the output signal of the AND circuit 42 is the H level.

Thus, the control unit 30 instructs the second switching element 28 to be turned off when the logical product becomes the true value (H level), where the logical product is performed by using the following two values (a) and (b):

(a) when the predetermined time period is elapsed, which is counted from the time when the operation signal g instructs the turned-on operation; and (b) the threshold current does not flow through the power switching element Sw.

Figure 4A:
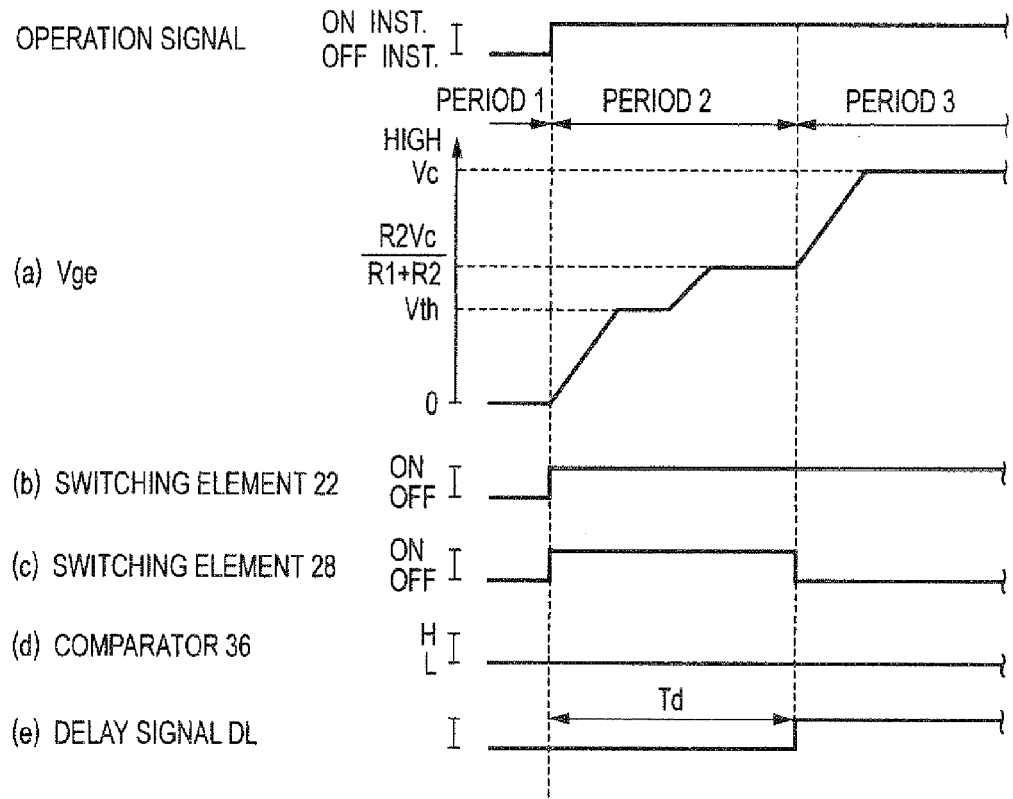
FIG. 4A and FIG. 4B show timing charts of a turning-on operation of the power switching element performed by the drive unit DU shown in FIG. 2.
Figure 4B:
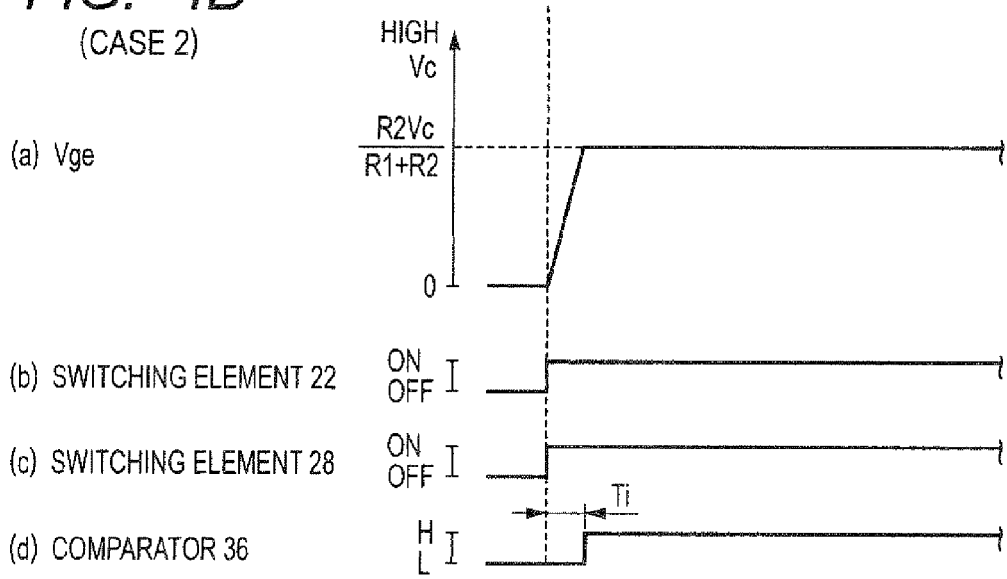

FIG. 4A and FIG. 4B are timing charts showing the turning-on operation of the switching elements in the drive unit DU shown in FIG. 2.

FIG. 4A shows the normal current flows in the power switching element Sw in the drive unit DU shown in FIG. 2. FIG. 4B shows an abnormal state of the power switching element Sw in the drive unit DU shown in FIG. 2 where an excess current flows in the power switching element Sw.

The timing chart (a) in FIG. 4A shows the transition of the gate voltage Vge of the power switching element Sw.

The timing chart (b) in FIG. 4A shows the transition of the operation state of the first switching element 22.

The timing chart (c) in FIG. 4A shows the transition of the operation state of the second switching element 28.

The timing chart (d) in FIG. 4A shows the transition of the operation state of the comparator 36.

The timing chart (e) in FIG. 4A shows the transition of the delay signal DL output from the delay circuit 40.

As shown in FIG. 4A and FIG. 4B, the level of the operation signal g is switched to the level which instructs the turning-on operation. This makes the first switching element 22 and the second switching element 28 being turned on. The gate voltage of the power switching element Sw is converged to the divided voltage $R2 \cdot Vc/(R1+R2)$ which is obtained by dividing the voltage Vc by the first resistance 24 and the second resistance 26.

It is set so that this divided voltage has a voltage value of not less than the threshold value Vth at which the power switching element Sw is turned on, namely, enters the turned-on state. Accordingly, in the case shown in FIG. 4A, when the gate voltage Vge of the power switching element Sw reaches the threshold voltage Vth, the power switching element Sw enters the mirror time period, so that the rising speed of the gate voltage of the power switching element Sw is temporarily and greatly decreased when compared with the rising speed of the gate voltage before the power switching element Sw enters the mirror time period. The gate voltage of the power switching element Sw is then converged to the divided voltage after completion of the mirror time period of the power switching element Sw. After this, the gate voltage Vge of the power switching element Sw is increased up to the voltage Vc of the power source 20 when the second switching element 28 is turned off after the delay time period Td is elapsed.

On the other hand, in the case 2 shown in FIG. 4B, the gate voltage Vge of the power switching element Sw is rapidly increased up to the divided voltage R2·Vc/(R+R2) which is obtained by dividing the voltage Vc by the first resistance 24 and the second resistance 26. In this case, because the comparator 36 outputs the H level signal and the control unit 30 detects the occurrence of an excess current, the control unit 30 does not instruct the second switching element 28 to be turned off even if the delay time period Td is elapsed. The delay time period Td is set so that it becomes longer than the time period Ti which is necessary for by the excess current detection means having the comparator 36 to detect the occurrence of an excess current. The excess current detection means is composed mainly of the comparator 36. Further, the threshold current which is used for detecting the occurrence of an excess current flowing in the power switching element Sw is set to a value of not more than the maximum current which flows in the power switching element Sw when the gate voltage of the power switching element Sw becomes the divided voltage R2·Vc/(R1+R2).

It is thereby possible to limit the current flowing in the power switching element Sw by limiting the gate voltage of the power switching element Sw in order to have the above divided voltage when an excess current flows in the power switching element Sw.

The maximum current flowing in the power switching element Sw is a large current when the gate voltage of the power switching element Sw reaches the voltage Vc of the power source 20. This large current flowing in the power switching element Sw does not make it possible to have or maintain the reliability in operation of the power switching element Sw. That is, the maximum current flowing in the power switching element Sw is adequately larger than the threshold current. However, in spite of this, the reason why the control unit 30 in the drive unit according to the first embodiment increases the gate voltage of the power switching element Sw up to the voltage Vc of the power source 20 is that the conductive power loss of the power switching element Sw, when the power switching element Sw is turned on, becomes small according to increasing of the gate voltage Vge of the power switching element Sw.

By the way, there is a time period where the current flowing in the power switching element Sw becomes an excessively large value (that is, the maximum current to be flowing in the power switching element Sw when the gate voltage becomes the voltage Vc) under the condition where the excess current flows in the power switching element Sw when the gate voltage of the power switching element Sw is drastically increased. This phenomenon is caused by the limitation of the operation speed of the excess current detection means. Accordingly, the excess current detection means causes an error detection that the excess current flows in the power switching element Sw. It is therefore necessary to select, namely, use a power switching element Sw having a strong capability to resist the above maximum current before the fail safe process is started after the excess current detection means detects the presence of the excess current. This increases the entire size of the power switching element Sw.

In particular, because the conductive power loss of the power switching element Sw becomes large in the case where the power switching element Sw and the freewheel diode FD are adjacently arranged in a same semiconductor substrate, it is necessary to decrease the thickness between the emitter and the collector in the power switching element Sw.

Because this case decreases the heat resistance of the power switching element Sw, an allowable current which flows in the power switching element Sw is also decreased. It is therefore necessary to select or use the power switching element Sw having a large surface area in order to resist the large current until the fail safe process is started.

As described above, the first embodiment provides the drive unit DU as the drive device for driving the switching element Sw (Swp, Swn) having the following effects (1) to (9).

(1) The drive unit DU as the drive device according to the first embodiment controls the first switching element 22 and the second switching element 28 to enter the second state from the first state when the power switching element Sw is turned on, where both the first state indicates that the first switching element 22 and the second switching element 28 are in the turned-on condition, and the second state indicates that the first switching element 22 enters the turned-on state and the second switching element 28 enters the turned-off state. This makes it possible to stepwisely change the gate voltage Vge of the power switching element Sw. In particular, it is possible to control the gate voltage Vge of the power switching element Sw with high accuracy on the basis of the quality of the first resistance 24 and the second resistance 26 during the time period in which both the first switching element 22 and the second switching element 28 enter the turned-on state (see (a), (b), and (c) shown in FIG. 4A).

(2) The drive unit DU as the drive device according to the first embodiment controls the first switching element 22 and the second switching element 28 so that the converged value of the gate voltage Vge of the power switching element Sw when both the first switching element 22 and the second switching element 28 are turned on is set to a value which is higher than the voltage Vth (which will be called to the "mirror voltage") when the power switching element Sw is turned on. This makes it possible to change the voltage to be supplied to the gate terminal of the power switching element Sw before and after the power switching element Sw is shifted to the mirror time period of the power switching element Sw when the power switching element Sw is switched to the turned-on state.

(3) The drive unit DU as the drive device according to the first embodiment controls the first switching element 22 and the second switching element 28 so that the first state is shifted to the second state after completion of the mirror time period of the power switching element Sw, where the first state indicates that the first switching element 22 and the second switching element 28 are simultaneously turned on, and the second state indicates that the first switching element 22 is turned on and the second switching element 28 is turned off. This makes it possible to change the gate voltage of the power switching element Sw before and after the power switching element Sw enters the mirror time period.

(4) The drive unit DU as the drive device according to the first embodiment is equipped with the delay circuit 40 capable of generating the delay signal DL. This delay signal DL indicates the timing which is delayed by the predetermined time period to the timing of the operation signal g. The operation signal g instructs the power switching element Sw to be turned on when receiving the operation signal g.

The control unit 30 in the drive unit DU controls the first switching element 22 and the second switching element 28 on the basis of the delay signal DL so that the first state is shifted to the second state after the mirror time period of the power switching element Sw is elapsed, where the first state indicates that the first switching element 22 and the second switching element 28 are simultaneously turned on, and the second state indicates that the first switching element 22 is turned on and the second switching element 28 is turned off. This makes it possible to change the gate voltage of the power switching element Sw before and after the power switching element Sw enters the mirror time period.

(5) The drive unit DU as the drive device according to the first embodiment is equipped with the delay circuit 40 capable of generating the delay signal DL when receiving the operation signal g. This makes it possible to correctly and timely generate the delay signal DL.

(6) In the drive unit DU as the drive device according to the first embodiment, the delay circuit 40 generates the delay signal DL so that the delay time period DL indicated by the delay signal DL is not less than the time period which is necessary for the excess current detection means (comprised of the comparator 36) to correctly detect the occurrence of an excess current flowing in the power switching element Sw. This makes it possible to switch the first state to the second state on the basis of the detection result of the occurrence of an excess current performed by the excess current detection means. By the way as previously described, the first state indicates that the first switching element 22 and the second switching element 28 are simultaneously turned on, and the second state indicates that the first switching element 22 is turned on and the second switching element 28 is turned off.

(7) When the excess current detection means comprised of the comparator 36 detects the occurrence of an excess current flowing in the power switching element Sw, the control unit 30 in the drive unit DU prohibits the switching operation of the first switching element 22 and the second switching element 28 to switch the first state with the second state after completion of the mirror time period of the power switching element Sw. In this case, the first state indicates that both the first switching element 22 and the second switching element 28 are in the turned-on condition, and the second state indicates that the first switching element 22 is turned on and the second switching element 28 is turned off. This makes it possible to prevent the current flowing in the power switching element Sw from further increasing.

(8) The drive unit DU as the drive device according to the first embodiment has the high voltage path Lh which is equipped with the passive element and the low voltage path Ll which is equipped with the passive element. The passive element in the high voltage path Lh is composed of the first resistance 24. The passive element in the low voltage path Ll is composed of the second resistance 26. This makes it possible for the high voltage path Lh and the low voltage path Ll to have a simple configuration.

(9) The drive unit DU as the drive device according to the first embodiment controls the operation of the power switching element Sw (the power switching element Swp at the high voltage side and the power switching element Swn at the low voltage side which are connected in series in the power conversion circuit (as the inverter IV). The drive unit DU as the drive device controls the switching operation of the first switching element 22 and the second switching element 28. This makes it possible to prevent an excess current from flowing in the power switching element Sw (Swp and Swn) when both the power switching element Swp at the high voltage side and the power switching element Swn at the low voltage side are simultaneously turned on.

Second Embodiment

A description will be given of the drive unit DU as the drive device for driving the power switching element Sw (Swp and Swn) according to the second embodiment of the present invention with reference to FIG. 5.

The second embodiment applies the drive unit DU as the drive device to a hybrid vehicle, as in the case for the first embodiment.

The difference between the second embodiment and the first embodiment will be explained below in detail. The explanation regarding the same components between the second embodiment and the first embodiment is omitted here.

Each of the drive units DU according to the second embodiment controls the first switching element 22 and the second switching element 28 so that the first state is shifted to the second state at a timing on the way in the mirror time period of the power switching element Sw, where, as in the case for the first embodiment, the first state indicates that the first switching element 22 and the second switching element 28 are simultaneously turned on, and the second state indicates that the first switching element 22 is turned on and the second switching element 28 is turned off.

This makes it possible to decrease the power loss of the power switching element Sw (Swp, Swn) caused by a current flowing in the power switching element Sw. That is, when compared with the case where the gate voltage Vge of the power switching element Sw is set to the voltage Vc after the mirror time period of the power switching element Sw is elapsed, the power loss of the power switching element Sw is increased when the gate voltage Vge of the power switching element Sw is converged to the divided voltage $R2 \cdot Vc/(R1+R2)$ which is obtained by dividing the voltage Vc by the first resistance 24 and the second resistance 26 after the mirror time period of the power switching element Sw is elapsed. That is, the divided voltage $R2 \cdot Vc/(R1+R2)$ is obtained by multiplying the second resistance 26 by the voltage Vc ad then dividing by the sum of the first and second resistances 24 and 26 respectively.

In order to decrease the power loss of the power switching element Sw, the control unit 30 in the drive unit DU switches the condition of the first switching element 22 and the second switching element 28 from the first state to the second state at a time on the way of the mirror time period. This makes it possible to decrease the power loss because the gate voltage Vge of the power switching element Sw is quickly increased to the target voltage Vc after completion of the mirror time period.

Figure 5:
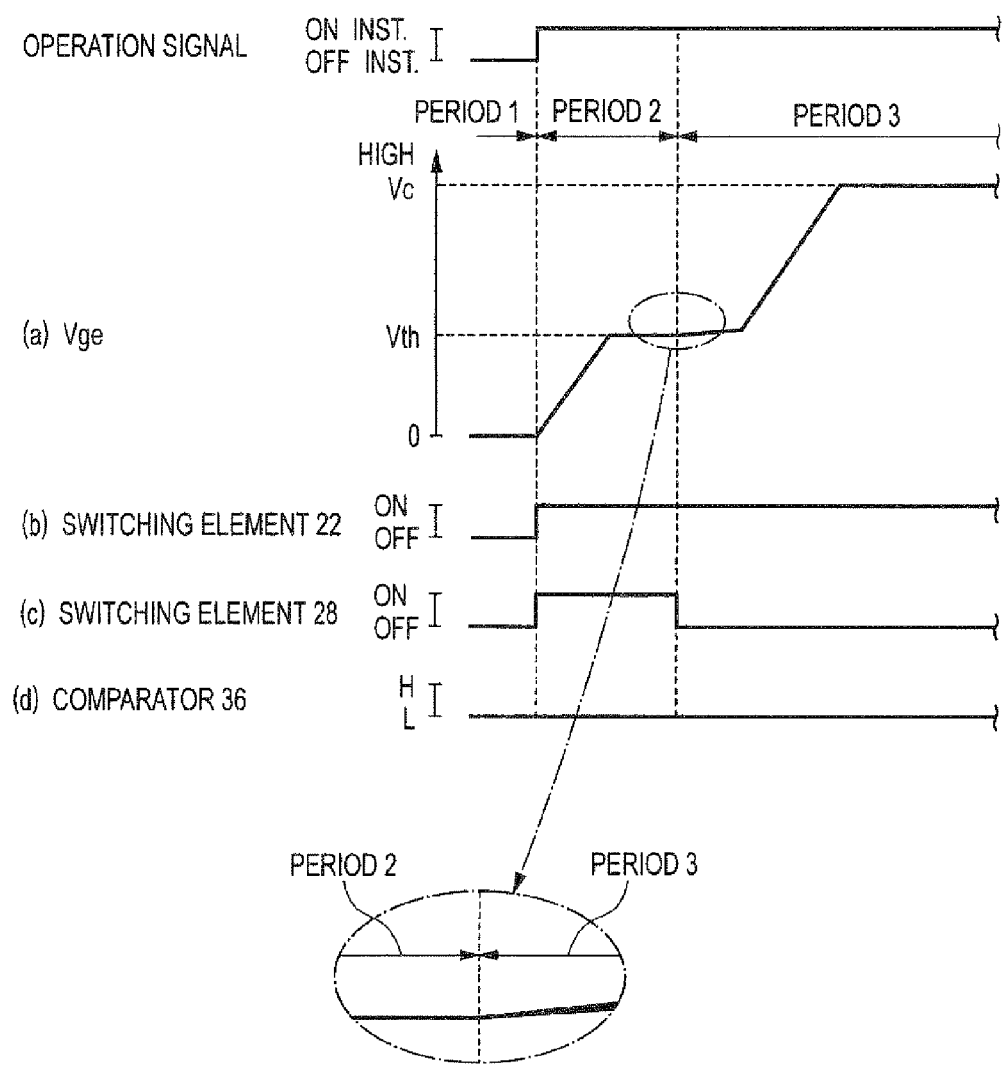
FIG. 5 shows timing charts of a turning-on operation of the power switching element performed by the drive unit DU according to a second embodiment of the present invention.

FIG. 5 shows timing charts of the driving operation (in particular, the normal current operation) of the switching elements in the drive unit DU as the drive device according to the second embodiment. That is, FIG. 5 shows timing charts (a) to (d) of the turning-on operation of the switching elements in the drive unit DU. The timing charts (a) to (d) shown in FIG. 5 correspond to the timing charts (a) to (d) shown in FIG. 4A, respectively.

Although the rising speed of the gate voltage Vge of the power switching element Sw during the mirror time period shown in FIG. 5 is very smaller than the rising speed of the gate voltage Vge before and after the mirror time period, the actual rising speed of the gate voltage Vge of the power switching element Sw during the mirror time period is slightly increased as shown in an enlarged view at the lower side in FIG. 5. Its rising speed of the gate voltage Vge is further increased when the start state is switched to the second state, where the first state is shifted to the second state after the mirror time period of the power switching element Sw. This first state indicates that both the first switching element 22 and the second switching element 28 are simultaneously turned on, and the second state indicates that the first switching element 22 is turned on and the second switching element 28 is turned off.

The timing to switch the state of the first switching element 22 and the second switching element 28 during the mirror time period previously described can be optimally set by adjusting the time constant of the delay circuit 40.

As described above, the drive unit DU as the drive device according to the second embodiment has the following effect (10) in addition to the effects (1), (2), and (4) to (9) described in the first embodiment.

(10) In the drive unit DU as the drive device according to the second embodiment, the delay time Td indicated by the delay signal DL is set to a timing which is required from the time when the power switching element Sw is switched to the turned-on state (when receiving the operation signal g) to a timing before the mirror time period is elapsed. This makes it possible to decrease the power loss of the power switching element Sw. As previously described, the operation signal g is the general term which includes the operation signals gup, gyp, gwp, gcp, gun, gvn, gwn, and gcn.

Third Embodiment

A description will be given of the drive unit DU as the drive device for driving the power switching element Sw (Swp and Swn) according to the third embodiment of the present invention with reference to FIG. 6. The third embodiment applies the drive unit DU as the drive device to a hybrid vehicle, as in the cases for the first and second embodiments.

The difference between the third embodiment and the first embodiment will be explained below in detail. The explanation regarding the same components between the third embodiment and the first embodiment is omitted here.

The drive unit DU as the drive device according to the third embodiment controls the operation of each of the first switching element 22 and the second switching element 28 so that the first state is shifted to the second state at the timing when the mirror time period of the power switching element Sw is elapsed, where, as in the case for the first and second embodiments, the first state indicates that the first switching element 22 and the second switching element 28 are simultaneously turned on, and the second state indicates that the first switching element 22 is turned on and the second switching element 28 is turned off. This makes it possible to decrease the power loss generated by the current flowing in the power switching element Sw while suppressing a surge voltage from generating and increasing.

Figure 6:
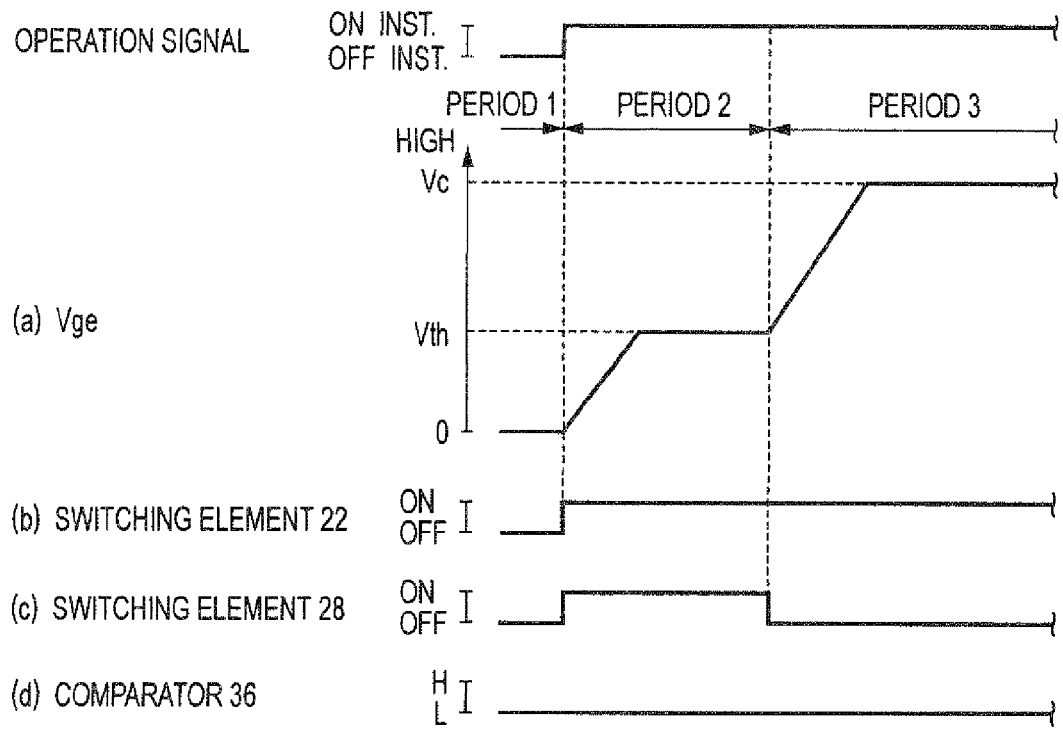
FIG. 6 shows timing charts of a turning-on operation of the power switching element performed by the drive unit DU according to a third embodiment of the present invention.

FIG. 6 shows the driving operation, in particular, the normal current operation to drive the power switching element Sw in the drive unit DU as the drive device according to the third embodiment. That is, FIG. 6 shows timing charts of the turning-on operation of the switching elements in the drive unit DU. The timing charts (a) to (d) shown in FIG. 6 correspond to the timing charts (a) to (d) shown in FIG. 4A, respectively.

As previously described and shown in FIG. 5, the rising speed of the gate voltage Vge of the power switching element Sw is increased when the first state is switched to the second state, where the first state indicates that both the first switching element 22 and the second switching element 28 are simultaneously turned on, and the second state indicates that the first switching element 22 is turned on and the second switching element 28 is turned off. Although the drive unit DU according to the second embodiment has the various effects previously described, the drive unit DU of the second embodiment has a possibility of increasing a surge voltage because the change of increasing the rising speed of the current flowing in the power switching element Sw is increased by increasing the rising speed of the gate voltage Vge of the power switching element Sw.

On the other hand, because the drive unit DU as the drive device according to the third embodiment switches the first state to the second state at the timing when the mirror time period is elapsed, the drive unit DU can decrease the power loss of the power switching element Sw as low as possible while suppressing the surge voltage from generating and increasing.

The timing to switch the condition of the first switching element 22 and the second switching element 28 during the mirror time period of the power switching element Sw (Swp, Swn) can be optimally set by adjusting the time constant of the delay circuit 40 as in the case for the second embodiment.

As described above, the drive unit DU as the drive device according to the third embodiment has the following effect (11) in addition to the effects (1), (2), and (4) to (9) as previously described in the first embodiment.

(11) in the drive unit DU as the drive device according to the third embodiment, the delay time Td indicated by the delay signal DL is set to a predicted time period which is required from the time when receiving the operation signal g (which instructs the power switching element Sw to be turned on) to the timing when the mirror time period of the power switching element Sw is elapsed. This makes it possible to decrease the power loss of the power switching element Sw as low as possible while suppressing a surge voltage of the power switching element Sw from generating and increasing.

As previously described, the operation signal g is the general term which includes the operation signals gup, gvp, gwp, gcp, gun, gvn, gwn, and gcn.

Fourth Embodiment

A description will be given of drive unit DU as the drive device for driving the power switching element Sw (Swp and Swn) according to the fourth embodiment of the present invention with reference to FIG. 7, FIG. 8A, and FIG. 8B. The fourth embodiment applies the drive unit DU as the drive device to a hybrid vehicle, as in the cases for the first to third embodiments.

The difference between the fourth embodiment and the first embodiment will be explained below in detail. The explanation regarding the same components between the fourth embodiment and the first embodiment is omitted here.

Figure 7:
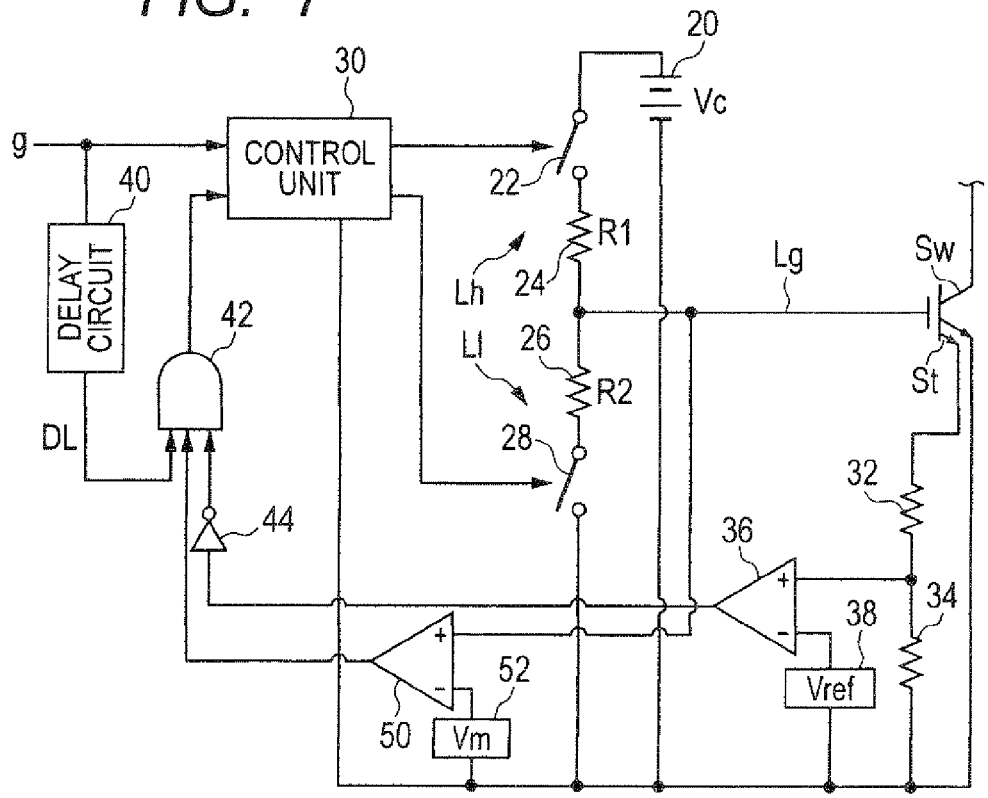
FIG. 7 is a view showing a circuit configuration of the drive unit DU as the drive device according to a fourth embodiment of the present invention.

FIG. 7 is a view showing the circuit configuration of the drive units DU as the drive device according to the fourth embodiment. The same components in the drive unit DU shown in FIG. 7 according to the fourth embodiment and FIG. 2 according to the first embodiment will be referred with the same reference numbers.

Each of the drive unit DU as the drive device according to the fourth embodiment controls the first switching element 22 and the second switching element 28 so that the first state is switched to the second state when the control unit 30 detects the completion of the mirror time period of the power switching element Sw on the basis of the gate voltage Vge of the power switching element Sw. That is, the drive unit DU as the drive device according to the fourth embodiment is further equipped with a comparator 50. The gate voltage Vge is input to the non-inverting input terminal (or positive input terminal designated by the reference character "+") of the comparator 50, and a completion detection voltage Vm is input to the inverting input terminal (or negative input terminal) as the other input terminal of the comparator 50. As shown in FIG. 7, the power source 52 supplies the completion detection voltage Vm to the inverting input terminal of the comparator 50. The completion detection voltage Vm is slightly higher than the voltage Vth at which the power switching element Sw is turned on.

The AND circuit 42 performs a logical product between the delay signal DL transferred from the delay circuit 40, the output signal of the inverter 44, and the output signal of the comparator 50. The AND circuit 42 outputs the signal regarding the logical product (true value or false value) to the control unit 30.

When receiving the signal regarding the logical product transferred from the AND circuit 42, the control unit 30 detects the completion of the mirror time period on the basis of the signal having the true value, and switches the first state to the second state of the first and second switching elements 22 and 28. In particular, the true value of the signal transferred from the comparator 50 indicates the following three conditions (C1), (C2), and (C3):

(C1) The delay time period Td has been elapsed after the operation signal g is switched to the turning-on operation instruction signal;

(C2) Any excess current is not detected; and (C3) The gate voltage Vge of the power switching element Sw becomes not less than the completion detection voltage Vm supplied from the power source 52.

As previously described, the operation signal g is the general term which includes the operation signals gup, gvp, gwp, gcp, gun, gvn, gwn, and gen.

Figure 8A:
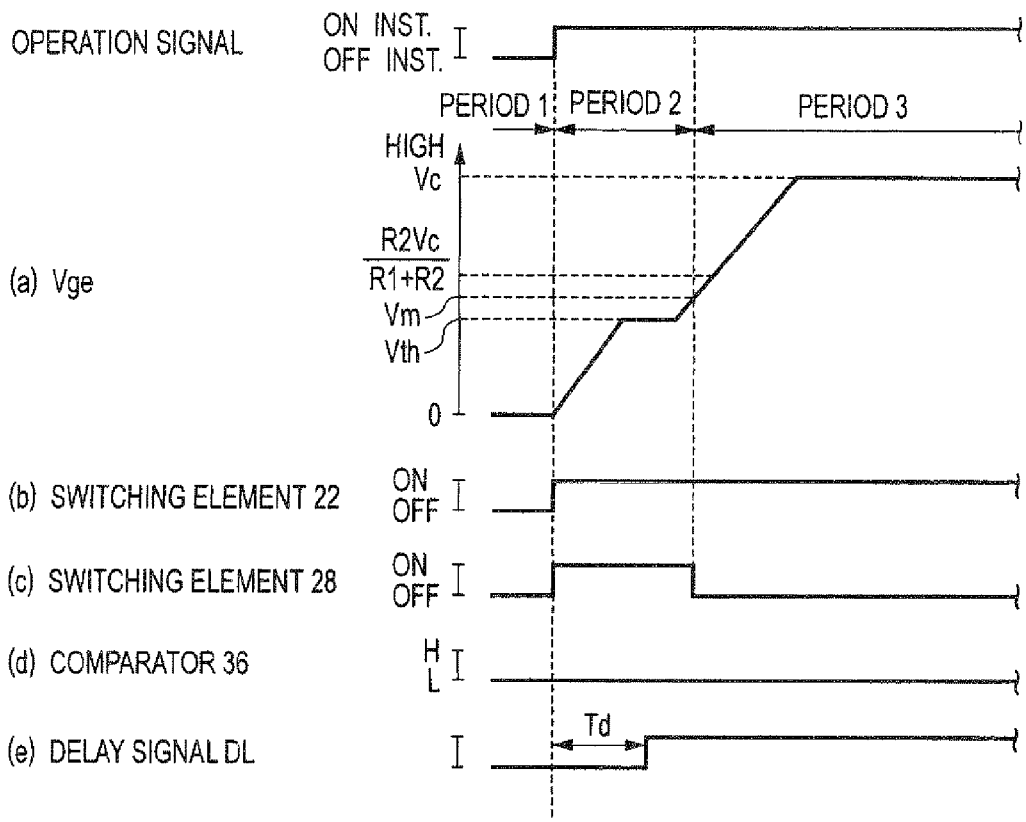
FIG. 8A and FIG. 8B show timing charts of a turning-on operation of the power switching element performed by the drive unit DU shown in FIG. 7.

The fourth embodiment sets an optimum time period to the delay time period Td (see the timing chart (e) shown in FIG. 8A). The optimum time period satisfies that the following conditions:

(S1) it is not less than the time period Td counted from the time when the operation signal g is switched to the turning-on operation instruction signal to the timing which is necessary for the excess current detection means composed mainly of the comparator 36 detects the occurrence of an excess current flowing in the power switching element Sw; and (S2) it is a time period which is necessary to complete the mirror time period of the power switching element Sw.

Figure 8B:
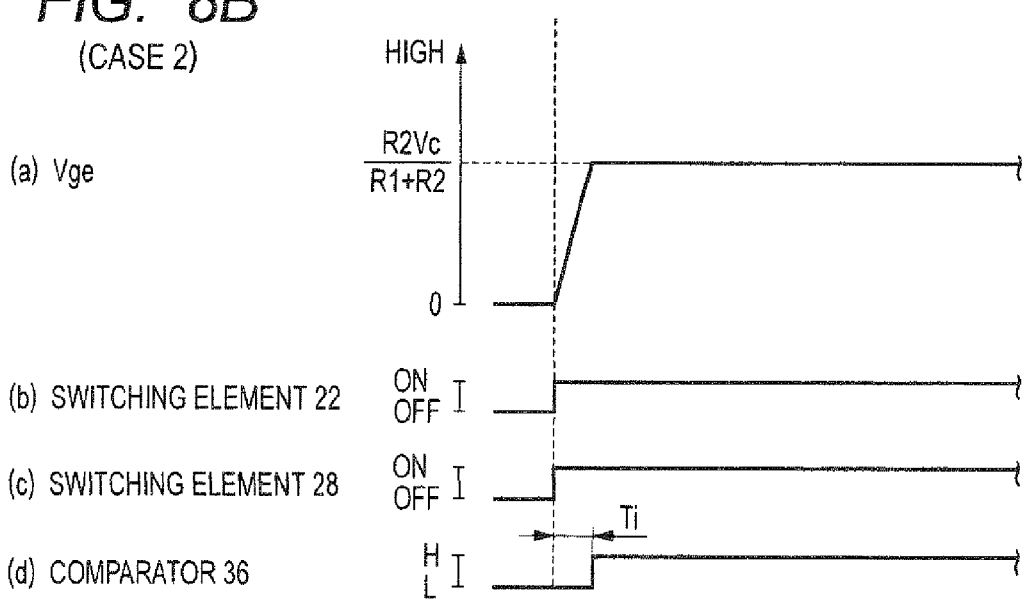

FIG. 8A and FIG. 8B are timing charts of the turning-on operation of the switching elements in each of the drive units DU shown in FIG. 7. In particular, the timing charts (a) to (e) shown in FIG. 8A indicate the operation of the drive unit DU when a normal current flows in the power switching element Sw. On the other hand, FIG. 8B indicates the operation of the drive unit DU when an excess current flows in the power switching element Sw. By the way, the timing charts (a) to (d) shown in each of FIG. 8A and FIG. 8B correspond to the timing charts (a) to (d) shown in FIG. 4A, respectively. The timing chart (e) in each of FIG. 8A and FIG. 8B shows the transition of the delay signal DL.

As shown in FIG. 8A and FIG. 8B, the drive unit DU switches the first state to the second state when the gate voltage Vge of the power switching element Sw is not less than the completion detection voltage Vm after the mirror time period is elapsed in the normal current operation. As previously described, the first state indicates that the first switching element 22 and the second switching element 28 are simultaneously turned on, and the second state indicates that the first switching element 22 is turned on and the second switching element 28 is turned off.

On the other hand, when the excess current flows in the power switching element Sw, the control unit 30 in the drive unit DU does not perform the above switching operation in order to limit the current flowing in the power switching element Sw with a current obtained by the converged value of the gate voltage Vge under the condition where both the first switching element 22 and the second switching element 28 enter the turned-on state.

The fourth embodiment sets an optimum time period to the delay time period Td (see the timing chart (e) shown in FIG. 8B) when the excess current flows in the power switching element Sw shown in FIG. 8B. The optimum time period satisfies that:

(S3) which is not less than the time period Ti counted from the time when the operation signal g is switched to the turning-on operation instruction signal to the timing when the excess current detection means (composed of the comparator 36, et al.) detects the occurrence of an excess current flowing in the power switching element Sw; and (S4) which is shorter than a time period until the mirror time period of the power switching element Sw is elapsed.

As previously described, the operation signal g is the general term which includes the operation signals gup, gvp, gwp, gcp, gun, gvn, gwn, and gen.

As described above, the drive unit DU as the drive device according to the fourth embodiment has the following effects (12) and (13) in addition to the effects (1), (2), and (4) to (9) described in the first embodiment.

(12) The control unit 30 in the drive unit DU according to the fourth embodiment switches the condition of first switching element 22 and the second switching element 28 from the first state to the second state when detecting the completion of the mirror time period of the power switching element Sw. This makes it possible to suppress the power loss from being increased while suppressing the surge voltage from generating.

(13) The control unit 30 in the drive unit DU according to the fourth embodiment switches the condition of first switching element 22 and the second switching element 28 from the first state to the second state when detecting the completion of the mirror time period of the power switching element Sw after the delay time period Td indicated by the delay signal DL is elapsed. This control makes it possible to inhibit the execution of the switching operation even if the gate voltage Vge becomes not less than the completion detection voltage Vm before the control unit 30 detects the occurrence of an excess current flowing in the power switching element Sw after the power switching element Sw is turned on.

Fifth Embodiment

A description will be given of the drive unit DU as the drive device for driving the power switching element Sw (Swp and Swn) according to the fifth embodiment of the present invention with reference to FIG. 9. The fifth embodiment applies the drive unit DU as the drive device to a hybrid vehicle, as in the cases for the first to fourth embodiments.

The difference between the fifth embodiment and the first embodiment will be explained below in detail. The explanation regarding the same components between the fifth embodiment and the first embodiment is omitted here.

The drive unit DU as the drive device according to the fifth embodiment adjusts the completion detection voltage Vm on the basis of the temperature of the power switching element Sw because the voltage Vth at which the power switching element Sw is turned on varies according to the temperature of the power switching element Sw. As previously described, the control unit 30 uses this completion detection voltage Vm in order to detect the completion timing at which the mirror time period of the power switching element Sw is completed.

Figure 9:
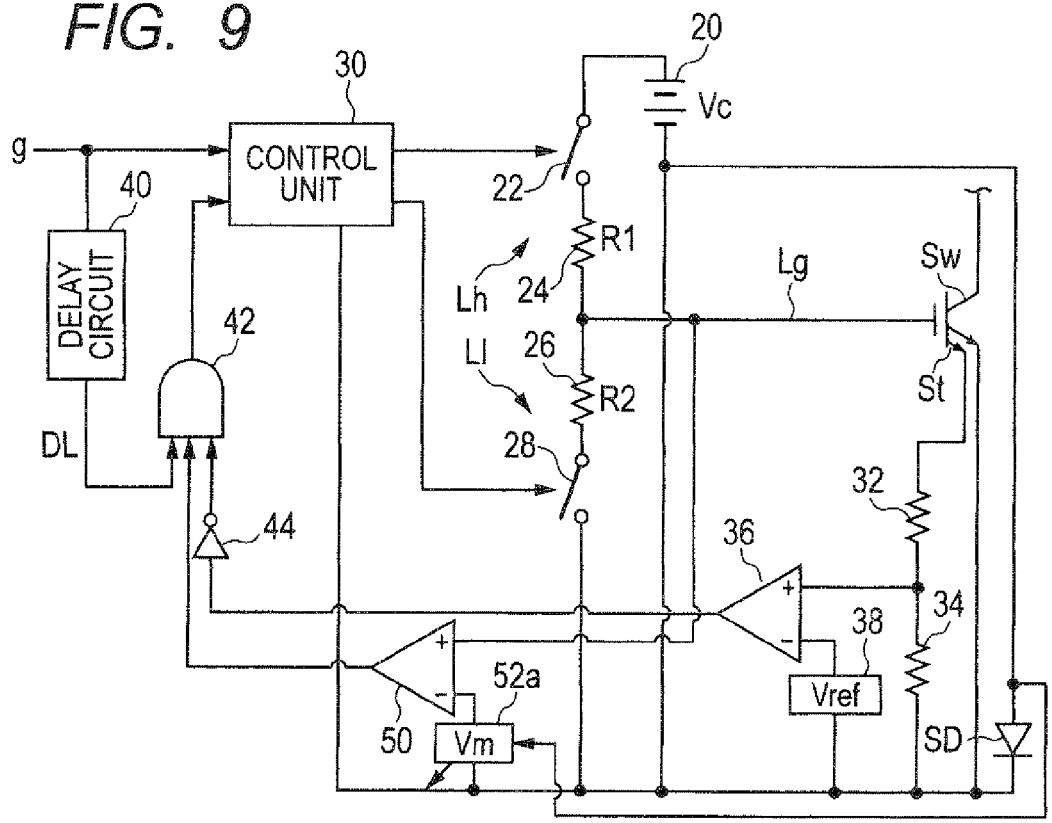
FIG. 9 is a view showing a circuit configuration of the drive unit as the drive device according to a fifth embodiment of the present invention.

FIG. 9 is a view showing a circuit configuration of the drive unit DU in the device according to the fifth embodiment of the present invention. The same components in the drive unit DU shown in FIG. 9 according to the fifth embodiment and FIG. 7 according to the fourth embodiment will be referred with the same reference numbers.

As shown in FIG. 9, the completion detection voltage Vm of the power source 52a is changed on the basis of an temperature detection signal transferred from a temperature sensitive diode SD which is placed near the power switching element Sw. The temperature sensitive diode SD is capable of detecting a current temperature of the power switching element Sw.

This makes it possible to adjust the completion detection voltage Vm on the basis of the temperature detection signal transferred from the temperature sensitive diode SD. The temperature detection signal indicates the temperature of the power switching element Sw. The adjusted completion detection voltage Vm is slightly larger than the predicted value at which the power switching element Sw is switched to the turned-on state.

As described above, the drive unit DU as the drive device according to the fifth embodiment has the following effect (14) in addition to the effects (1), (2), and (4) to (9) described in the first embodiment.

(14) The control unit 30 in the drive unit DU according to the fifth embodiment changes the completion detection voltage Vm on the basis of the detected temperature of the power switching element Sw. This makes it possible to obtain the optimum completion detection voltage Vm on the basis of the predicted gate voltage Vge at the current temperature during the mirror time period of the power switching element Sw.

Sixth Embodiment

A description will be given of the drive unit DU as the drive device for driving the power switching element Sw (Swp and Swn) according to the sixth embodiment of the present invention with reference to FIG. 10. The sixth embodiment also applies the drive unit DU as the drive device to a hybrid vehicle, as in the cases for the first to fifth embodiments.

The difference between the sixth embodiment and the fourth embodiment will be explained below in detail. The explanation regarding the same components between the sixth embodiment and the fourth embodiment is omitted here.

The drive unit DU as the drive device according to the sixth embodiment detects the completion of the mirror time period of the power switching element Sw based on the change of the gate voltage Vge of the power switching element Sw.

Figure 10:
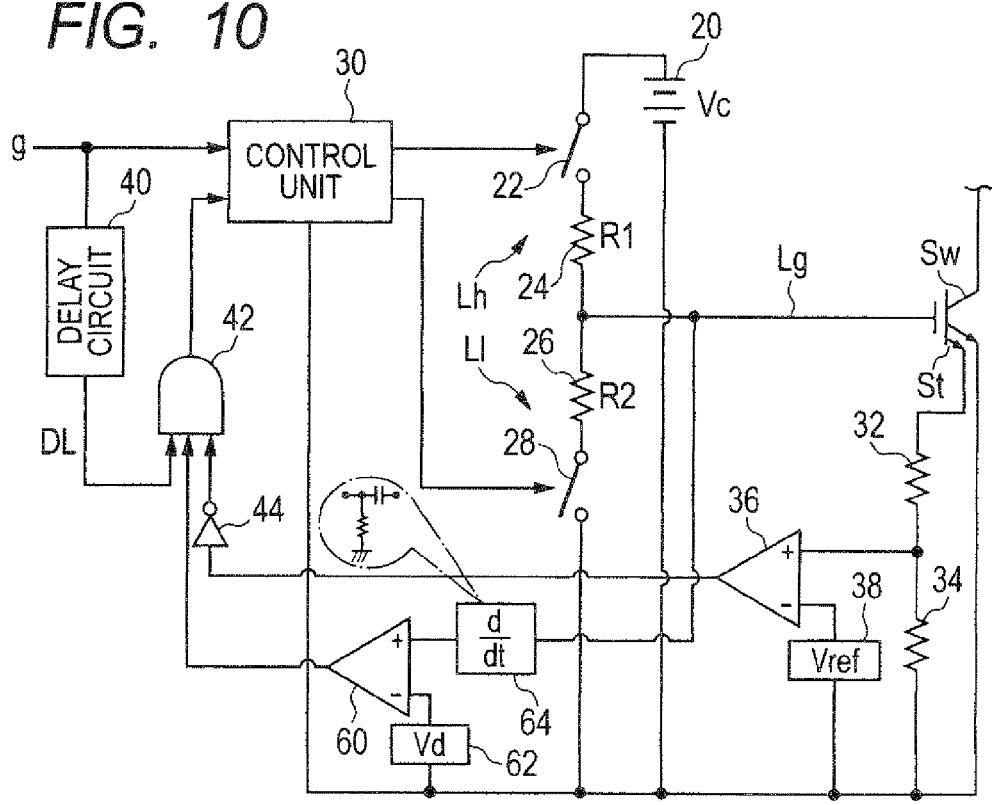
FIG. 10 is a view showing a circuit configuration of the drive unit as the drive device according to a sixth embodiment of the present invention.

FIG. 10 is a view showing a circuit configuration of the drive unit DU in the drive device according to the sixth embodiment of the present invention. The same components in the drive unit DU shown in FIG. 10 according to the sixth embodiment and FIG. 2 according to the first embodiment will be referred with the same reference numbers.

As shown in FIG. 10, the drive unit DU according to the sixth embodiment is further equipped with a differentiation circuit 64. The differentiation circuit 64 receives the gate voltage Vge of the power switching element Sw, and differentiates the received gate voltage Vge. For example, the differentiation circuit 64 is composed of an RC circuit. The differentiation circuit 64 outputs the operation result of differentiation of the gate voltage Vge, which indicates the change speed of the gate voltage Vge. The comparator 60 receives the operation result transferred from the differentiation circuit 64 through the non-inverting input terminal thereof and receives the voltage Vd of the power source 62 through the inverting input terminal thereof.

An optimum value is set to the voltage Vd in order for the comparator 60 to output a different output value on the basis of (D1) the output value of the differentiation circuit 64 during the time period other than the mirror time period and (D2) the output value of the differentiation circuit 64 mirror time period of the power switching element Sw.

The AND circuit 42 performs the logical product between the delay signal DL, the output signal of the inverter 44, and the output signal of the comparator 60, and outputs a signal indicating the result of the logical product to the control unit 30. When receiving the signal indicating the result of the logical product transferred from the AND circuit 42, the control unit 30 switches the first state to the second state when the received signal having a true value (for example, high level) of the above logical product, where the first state indicates that the first switching element 22 and the second switching element 28 are simultaneously turned on, and the second state indicates that the first switching element 22 is turned on and the second switching element 28 is turned off.

That is, the true value of the logical product output from the AND circuit 42 satisfies the following three conditions (E1), (E2), and (E3):

(E1) The delay time Td is elapsed counted from the time when the operation signal g is switched to the turning-on instruction signal;

(E2) No excess current flows in the power switching element Sw; and (E3) The rising speed of the gate voltage Vge of the power switching element Sw is not less than a predetermined value.

As previously described, the operation signal g is the general term which includes the operation signals gup, gvp, gwp, gcp, gun, gvn, gwn, and gcn.

By the way, the delay time period Td determined on the basis of the delay signal DL is set so that:

(E4) the delay time Td is not less than the time period which is counted from the time when the operation signal g is switched to the turning-on operation instruction signal to the timing when the power switching element Sw enters the mirror time period, and (E5) the delay time Td is not more than the time period until the timing when the mirror time period is completed.

Figure 11:
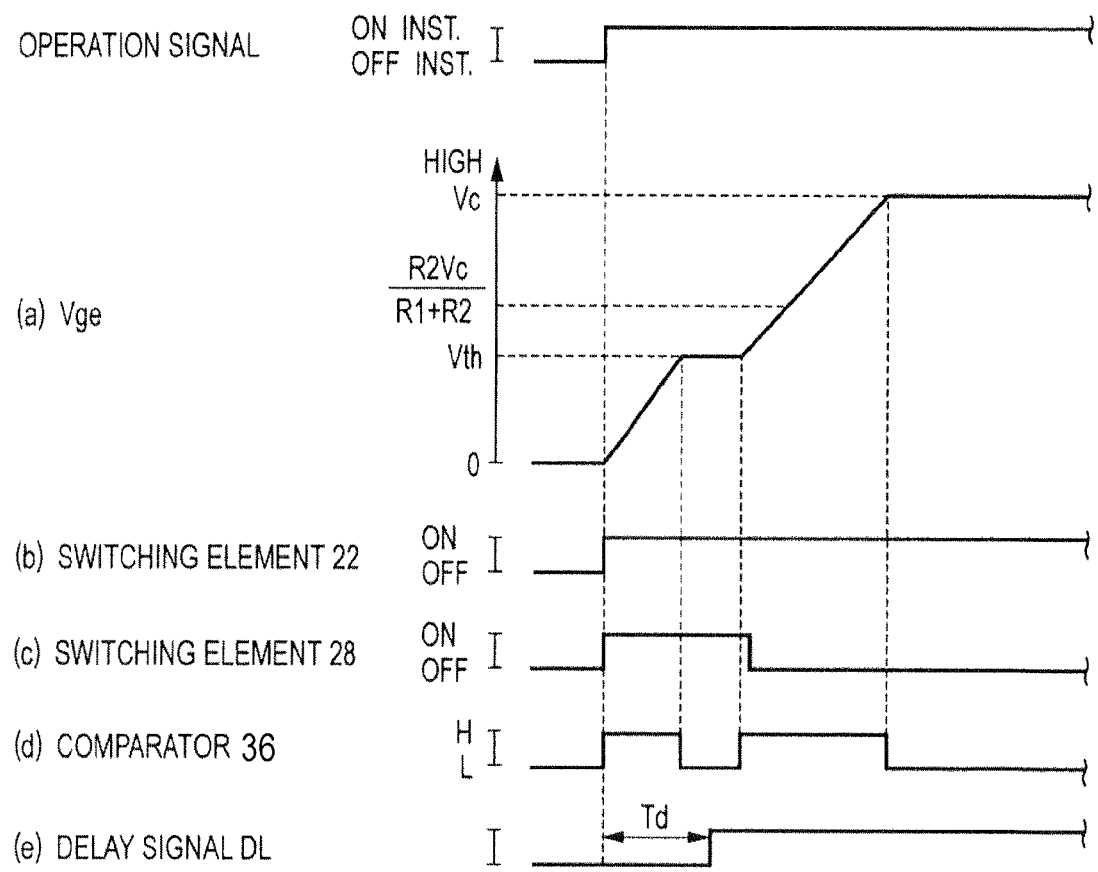
FIG. 11 shows timing charts of a turning-on operation of the power switching element performed by the drive unit DU shown in FIG. 10.

FIG. 11 shows timing charts of the turning-on operation of the switching elements under the control of the drive unit DU shown in FIG. 10.

The timing charts (a) to (d) shown in FIG. 11 correspond to the timing charts (a) to (d) shown in FIG. 4A or FIG. 4B, respectively. The timing chart (e) shown in FIG. 11 indicates the transition of the delay signal DL.

As shown in FIG. 11, the gate voltage Vge of the power switching element Sw is increased when both the first switching element 22 and the second switching element 28 are simultaneously turned on after the operation signal g is switched to the turning-on operation instruction signal.

Although the comparator 60 outputs the comparison signal which indicates that the change speed of the gate voltage Vge is larger than that during the mirror time period, the control unit 30 does not perform the switching operation to switch the first state to the second state because the delay time period Td indicated by the delay signal DL is not elapsed.

After this, although the delay time period Td indicated by the delay signal DL has been elapsed, the control unit 30 does not perform the switching operation to switch the first state to the second state because the comparator 60 outputs the signal of the comparison result which indicates that the change speed of the gate voltage Vge is generated during the mirror time period.

Finally, when the comparator 60 outputs the comparison result signal which indicates that the current change speed of the gate voltage Vge is larger than that during the mirror time period, the control unit 30 performs the switching operation to switch the first state to the second state.

As described above, the drive unit DU as the drive device according to the sixth embodiment has the following effect (15) in addition to the effects (1), (2), and (4) to (9) described in the first embodiment.

(15) The control unit 30 in the drive unit DU according to the sixth embodiment detects the completion of the mirror time period of the power switching element Sw. This makes it possible to precisely detect the completion timing of the mirror time period in the power switching element Sw.

Seventh Embodiment

A description will be given of the drive unit DU as the drive device for driving the power switching element Sw (Swp and Swn) according to the seventh embodiment of the present invention with reference to FIG. 12 and FIG. 13. The seventh embodiment also applies the drive unit DU as the drive device to a hybrid vehicle, as in the cases for the first to sixth embodiments.

The difference between the seventh embodiment and the first embodiment will be explained below in detail. The explanation regarding the same components between the seventh embodiment and the first embodiment is omitted here.

Figure 12:
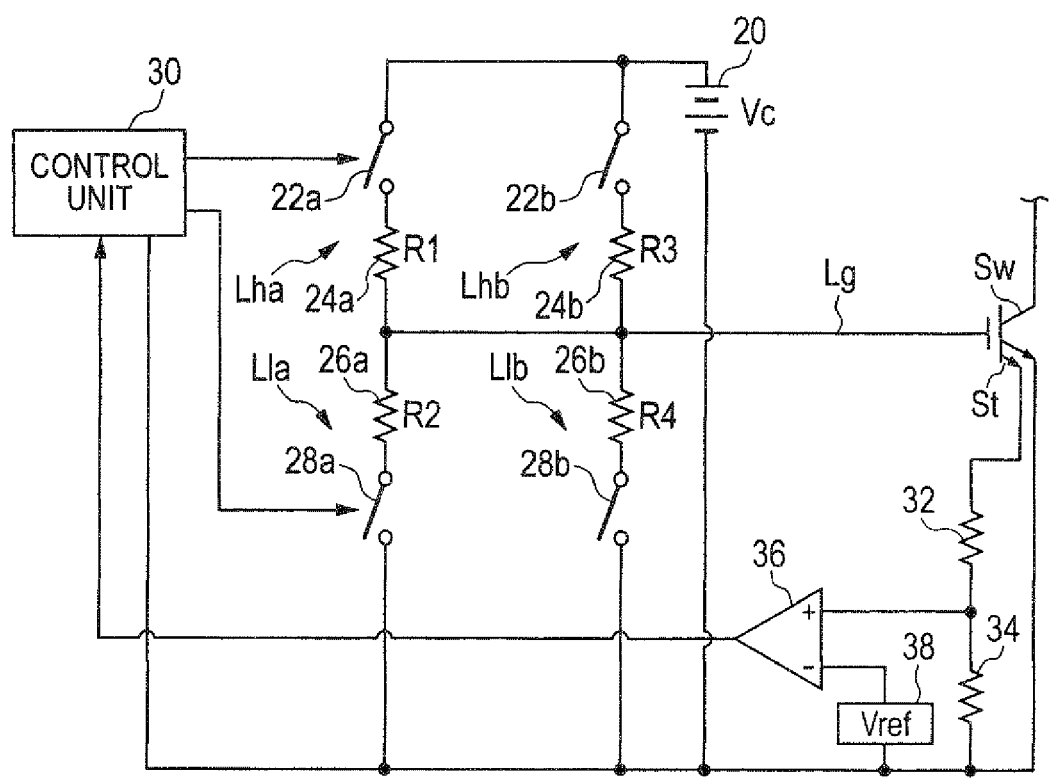
FIG. 12 is a view showing a circuit configuration of the drive unit DU according to a seventh embodiment of the present invention.

FIG. 12 is a view showing a circuit configuration of the drive unit DU as the drive device according to the seventh, embodiment of the present invention. The same components in the drive unit DU shown in FIG. 32 according to the seventh embodiment and FIG. 2 according to the first embodiment will be referred with the same reference numbers.

The drive unit DU as the drive device according to the seventh embodiment has a plurality of the high voltage paths Lha and the low voltage paths Llb. As shown in FIG. 12, the drive unit DU has two pairs of the high voltage path and the low voltage path. That is, the first high voltage path Lha is composed of the first switching element 22a and the first resistance 24a, and the second high voltage path Lhb is composed of the first switching element 22b and the first resistance 24b. Further, the first low voltage path Lla is composed of the second switching element 28a and the second resistance 26a. The second low voltage path Llb is composed of the second switching element 28b and the second resistance 26b.

It is set so that the first divided voltage value Vc·R2/(R1+R2) of the voltage Vc is lower in voltage than the second divided voltage value Vc·R4/(R3+R4) of the voltage Vc, where the first divided voltage value Vc·R2/(R1+R2) is obtained by the first resistance 24a having the resistance value R1 in the first high voltage path Lha and the second resistance 26a having the resistance value R2 in the first low voltage path Lla, and the second divided voltage value Vc·R4/(R3+R4) is obtained by the first resistance 24b having the resistance value R3 in the second high voltage path Lhb and the second resistance 26b having the resistance value R4 in the second low voltage path Llb.

In particular, it is set in the drive unit DU shown in FIG. 12 so that the threshold voltage Vth has a voltage between the first divided voltage value and the second divided voltage value, where the power switching element Sw is turned on at the threshold voltage.

Still further, it is set in the drive unit DU shown in FIG. 12 so that the sum of the resistance value R1 of the first resistance 24a in the first high voltage path Lha and the resistance value R2 of the second resistance 26a in the first low voltage path Lla is larger than the sum of the resistance value R3 of the first resistance 24b in the second high voltage path Lhb and the resistance value R4 of the second resistance 26b in the second low voltage path Llb.

This makes it possible for the following state ST1 to have a rapid charging speed to charge the gate voltage Vge of the power switching element Sw when compared with the following state ST2. In the state ST1, both the first switching element 22b in the second high voltage path Lhb and the second switching element 28b in the second low voltage path Llb are simultaneously turned on. In the state ST2, both the first switching element 22a in the first high voltage path Lha and the second switching element 28a in the first low voltage path Lla are simultaneously turned on.

Figure 13:
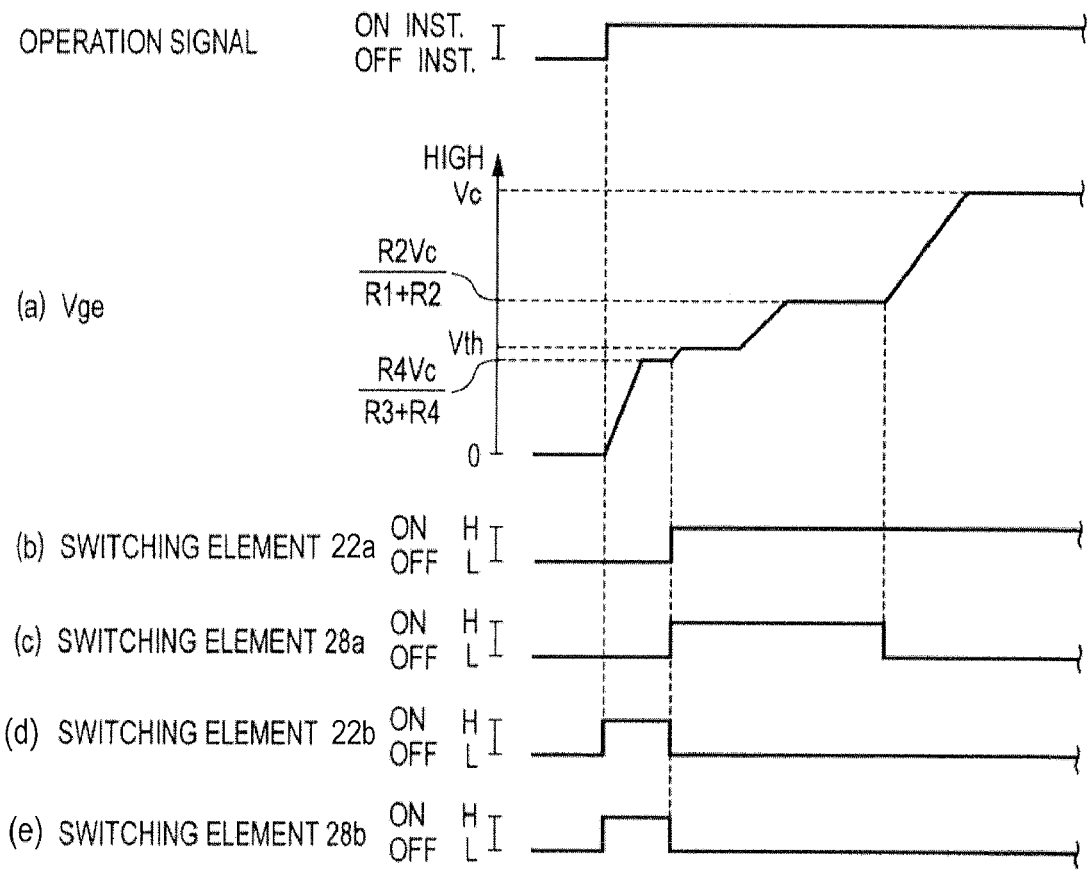
FIG. 13 shows timing charts of a turning-on operation of the power switching element performed by the drive unit DU shown in FIG. 12.

FIG. 13 shows the following timing charts (a) to (e) of the turning-on operation of the power switching element Sw in the drive unit DU shown in FIG. 12.

FIG. 13 shows the process to drive the power switching element Sw in the drive unit DU shown in FIG. 12.

The timing chart (a) in FIG. 13 shows the transition of the gate voltage Vge of the power switching element Sw.

The timing chart (b) in FIG. 13 shows the transition of the operation state of the first switching element 22a in the first high voltage path Lha.

The timing chart (c) in FIG. 13 shows the transition of the operation state of the second switching element 28a in the first low voltage path Lla.

The timing chart (d) in FIG. 13 shows the transition of the operation state of the first switching element 22b in the second high voltage path Lhb.

The timing chart (e) in FIG. 13 shows the transition of the second switching element 28b in the second low voltage path Llb.

As shown in FIG. 13, when the operation signal g is switched to the turning-on operation instruction signal, both the first switching element 22b and the second switching element 28b are turned on. As previously described, the operation signal g is the general term which includes the operation signals gup, gyp, gwp, gcp, gun, gvn, gwn, and gen.

This rapidly increases the gate voltage Vge of the power switching element Sw to the divided voltage which is obtained by dividing the voltage Vc by the first resistance 24b and the second resistance 26b.

After the gate voltage Vge of the power switching element Sw is converged to the divided voltage of the voltage Vc, the control unit 30 switches the condition of first switching elements and the second switching elements from the first-on state to the second-on state, where the first-on state indicates the condition in which both the first switching element 22b and the second switching element 28b are turned on, and the second-on state indicates the condition in which both the first switching element 22a and the second switching element 28a are turned on.

This makes it possible for the control unit 30 to shift the power switching element Sw into the mirror time period while maintaining a low charging speed of the gate voltage of the power switching element Sw.

After completion of the mirror time period in the power switching element Sw, the control unit 30 in the drive unit DU switches the condition of first switching elements and the second switching elements from the second-on state to the second state, where the second state, as previously described, indicates the condition where the first switching element 22a is turned on and the second switching element 28b is turned off.

It is possible to switch the first-on state to a first-off state on the basis of the delay signal of the delay circuit which has the same configuration of the delay circuit 40 shown in FIG. 2, where the first-off state indicates the condition in which the first switching element 22b is turned off and the second switching element 28b is also turned off.

Further, it is possible to switch the current state to the second-on state on the basis of the delay signal. Still further, it is also possible to switch the current state to the second state by the delay circuit 40 having the same configuration of the delay circuit 40 in the drive unit DU according to the first embodiment shown in FIG. 2, where the second state indicates the condition in which the first switching element 22a is turned on and the second switching element 28a is also turned off.

As described above, the drive unit DU as the drive device according to the seventh embodiment has the following effect (16) in addition to the effects (1), (2), and (4) to (9) described in the first embodiment.

(16) In the control unit 30 in the drive unit DU according to the seventh embodiment, it is set so that:

(F1) the first divided voltage value Vc·R2/(R1+R2) of the voltage Vc is larger than the threshold voltage Vth, where the first divided voltage value Vc·R2/(R1+R2) is obtained by dividing the voltage Vc by the first resistance 24a having the resistance value R1 in the first high voltage path Lha and the second resistance 26a having the resistance value R2 in the first low voltage path Lla;

(F2) the second divided voltage value Vc·R4/(R3+R4) of the voltage Vc is smaller than the threshold voltage Vth, where the second divided voltage value Vc·R4/(R3+R4) is obtained by dividing the voltage Vc by the first resistance 24b having the resistance value R3 in the second high voltage path Lhb and the second resistance 26b having the resistance value R4 in the second low voltage path Llb; and (F3) the relationship of R1+R2>R3+R4 is satisfied.

This makes it possible to rapidly increase the gate voltage Vge of the power switching element Sw to the divided voltage value Vc·R4/(R3+R4). In particular, because this divided voltage is lower than the threshold voltage Vth at which the power switching element Sw is turned on, it is possible to avoid surge voltage from generating and increasing while increasing the switching speed of the power switching element Sw.

Eighth Embodiment

A description will be given of the drive unit DU as the drive device for driving the power switching element Sw (Swp and Swn) according to the eighth embodiment of the present invention with reference to FIG. 14.

The eighth embodiment also applies the drive unit DU as the drive device to a hybrid vehicle, as in the cases for the first to seventh embodiments.

The difference between the eighth embodiment and the first embodiment will be explained below in detail. The explanation regarding the same components between the eighth embodiment and the first embodiment is omitted here.

Figure 14:
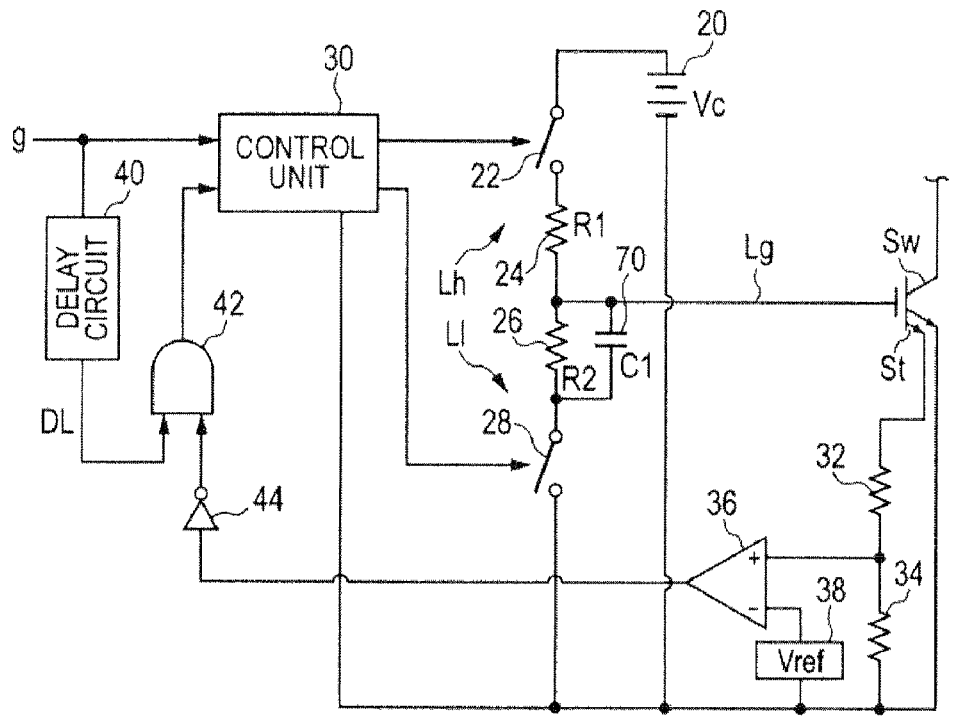
FIG. 14 is a view showing a circuit configuration of the drive unit DU as the drive device according to an eighth embodiment of the present invention.

FIG. 14 is a view showing a circuit configuration of the drive unit DU DU as the drive device according to the eighth embodiment of the present invention. The same components in the drive unit DU shown in FIG. 14 according to the eighth embodiment and FIG. 2 according to the first embodiment will be referred with the same reference numbers.

In the configuration of the drive unit DU shown in FIG. 14, a capacitance 70 is connected in parallel to the second resistance 26. This configuration makes it possible for the capacitance 70 having an electrical charge C1 to control the rising speed of the gate voltage Vge of the power switching element Sw, and it is thereby possible for the first resistance 24 to have an adequately small resistance value R1.

Figure 15:
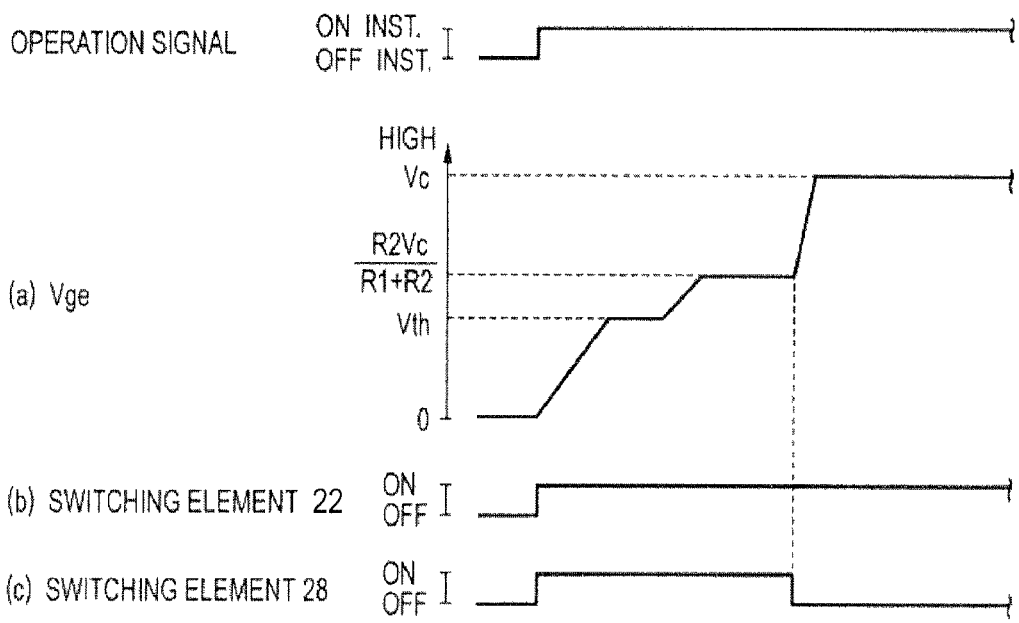
FIG. 15 shows timing charts showing a turning-on operation of the power switching element performed by the drive unit shown in FIG. 14.

FIG. 15 show timing charts of the turning-on operation of the switching elements under the control of the drive unit shown in FIG. 10.

The timing charts (a) to (c) shown in FIG. 15 correspond to the timing charts (a) to (c) shown in FIG. 4A, respectively.

As shown in FIG. 15, the drive unit DU as the drive device according to the eighth embodiment controls the first switching element 22 and the second switching element 28 so that the first state is switched to the second state, where the first state indicates that the first switching element 22 and the second switching element 28 are simultaneously turned on, and the second state indicates that the first switching element 22 is turned on and the second switching element 28 is turned off. This configuration of the drive unit DU makes it possible to rapidly increase the gate voltage Vge of the power switching element Sw to the voltage Vc. It is further possible for the rising speed of the gate voltage Vge of the power switching element Sw to have a value which is adequately larger than the rising speed of the gate voltage Vge in the first state where both the first switching element 22 and the second switching element 28 are simultaneously turned on.

This makes it possible to decrease the power loss (or conductive power loss) of the power switching element Sw (Swp, Swn) by increasing the gate voltage Vge after the completion of the mirror time period while suppressing the rising speed of the gate voltage VGe during the mirror time period in order to suppress a surge voltage from generating and increasing.

As described above, the drive unit DU as the drive device according to the eighth embodiment has the following effect (17) in addition to the effects (1), (2), and (4) to (9) described in the first embodiment.

(17) The drive unit DU according to the eighth embodiment has the capacitance 70 which is placed in parallel to the second resistance 26. This configuration of the drive unit DU makes it possible to decrease the resistance value of the first resistance 24 as low as possible while the rising speed of the gate voltage Vge of the power switching element Sw is limited by the capacitance 70 when both the first switching element 22 and the second switching element 28 are simultaneously turned on. It is thereby possible to adequately increase the rising speed of the gate voltage Vge of the power switching element Sw during the second state which indicates that the first switching element 22 is turned on and the second switching element 28 is turned off.

Ninth Embodiment

A description will be given of the drive unit DU as the drive device for driving the power switching element Sw (Swp and Swn) according to the ninth embodiment of the present invention with reference to FIG. 16 and FIG. 17.

The ninth embodiment also applies the drive unit DU as the drive device to a hybrid vehicle, as in the cases for the first to eighth embodiments.

The difference between the ninth embodiment and the eighth embodiment will be explained below in detail. The explanation regarding the same components between the ninth embodiment and the eighth embodiment is omitted here.

Figure 16:
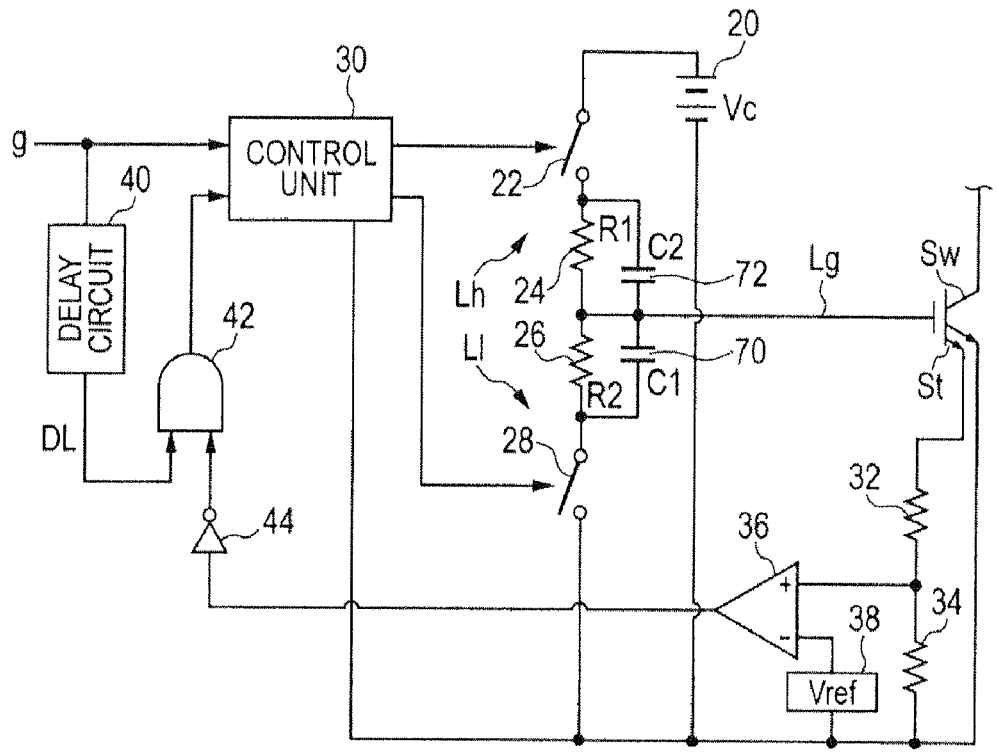
FIG. 16 is a view showing a circuit configuration of the drive unit DU performed in the device according to a ninth embodiment of the present invention.

FIG. 16 is a view showing a circuit configuration of the drive unit DU in the device according to the ninth embodiment of the present invention. The same components in the drive unit DU shown in FIG. 16 according to the ninth embodiment and FIG. 14 according to the eighth embodiment will be referred with the same reference numbers.

As shown in FIG. 16, a capacitance 72 is placed in parallel to the first resistance 24. The ninth embodiment determines the capacitances 70 and 72 having the electric charges C1 and C2 so that the divided value Vc·C2/(C1+C2) obtained by dividing the voltage Vc by the capacitances 70 and 72 is lower than the threshold value Vth at which the power switching element Sw is turned on.

Figure 17:
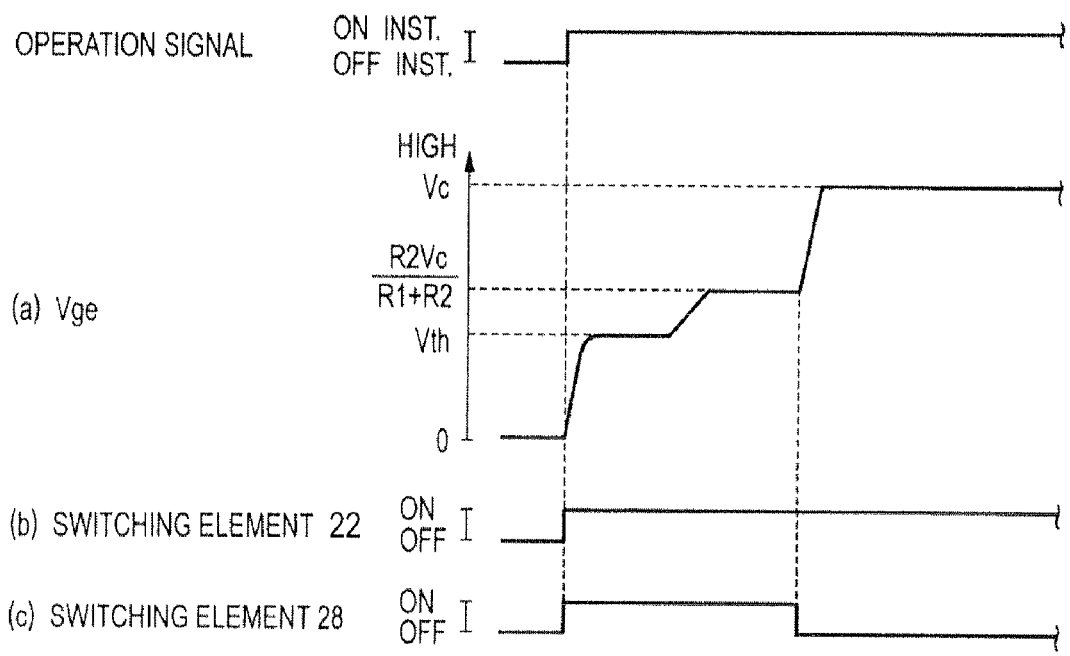
FIG. 17 shows timing charts showing a turning-on operation of the power switching element performed by the drive unit DU shown in FIG. 16.

FIG. 17 shows timing charts of the turning-on operation of the switching elements under the control of the drive unit DU shown in FIG. 16.

The timing charts (a), (b), and (c) shown in FIG. 17 correspond to the timing charts (a), (b), and (c) shown in FIG. 4A, respectively.

As shown in FIG. 17, the gate voltage Vge of the power switching element Sw is rapidly increased to the divided voltage obtained by dividing the voltage Vc by the capacitances 70 and 72 when the operation signal g is switched to the turning-in operation instruction signal, and both the first switching element 22 and the second, switching element 28 are turned on. After this, although the gate voltage Vge of the power switching element Sw is increased to the divided voltage obtained by the first resistance 24 and the second resistance 26, the rising speed of the gate voltage Vge is limited by the electric charge of the capacitance 70, as in the case of the eighth embodiment previously described. This makes it possible to limit the charging speed at the gate terminal of the power switching element Sw during the mirror time period. After this, it is possible to rapidly increase the gate voltage Vge of the power switching element Sw when the first state is switched to the second state, where the first state indicates that the first switching element 22 and the second switching element 28 are simultaneously turned on, and the second state indicates that the first switching element 22 is turned on and the second switching element 28 is turned off.

As described above, the drive unit DU as the drive device according to the ninth embodiment has the following effect (18) in addition to the effects described in the eighth embodiment.

(18) In the drive unit DU according to the ninth embodiment, the capacitance 72 is placed in parallel to the first resistance 24, and the capacitance 70 is placed in parallel to the second resistance 26, and it is set so that the divided voltage value obtained by dividing the voltage Vc by the capacitance 70 and the capacitance 72 is smaller than the threshold voltage Vth. This makes it possible to decrease the time period counted from the time when the operation signal g becomes the turning-on operation instruction signal to the time when the power switching element Sw enters the mirror time period.

Tenth Embodiment

A description will be given of the drive unit DU as the drive device equipped with drive unit DS for driving the power switching element Sw (Swp and Swn) according to the tenth embodiment of the present invention with reference to FIG. 18.

The tenth embodiment also applies the drive unit DU as the drive device to a hybrid vehicle, as in the cases for the first to ninth embodiments.

The difference between the tenth embodiment and the first embodiment will be explained below in detail. The explanation regarding the same components between the tenth embodiment and the first embodiment is omitted here.

The drive unit DU according to the tenth embodiment mainly uses the first switching element 22, the first resistance 24, the second resistance 26, and the second switching element 28. In particular, it is set so that the divided voltage obtained by dividing the voltage Vc by the first resistance 24 and the second resistance 26 is lower than the threshold voltage Vth with which the power switching element Sw is turned off. This makes it possible to suppress the rising speed of the current flowing through the power switching element Sw from excessively increasing during the time period until the power switching element Sw is turned off.

Figure 18:
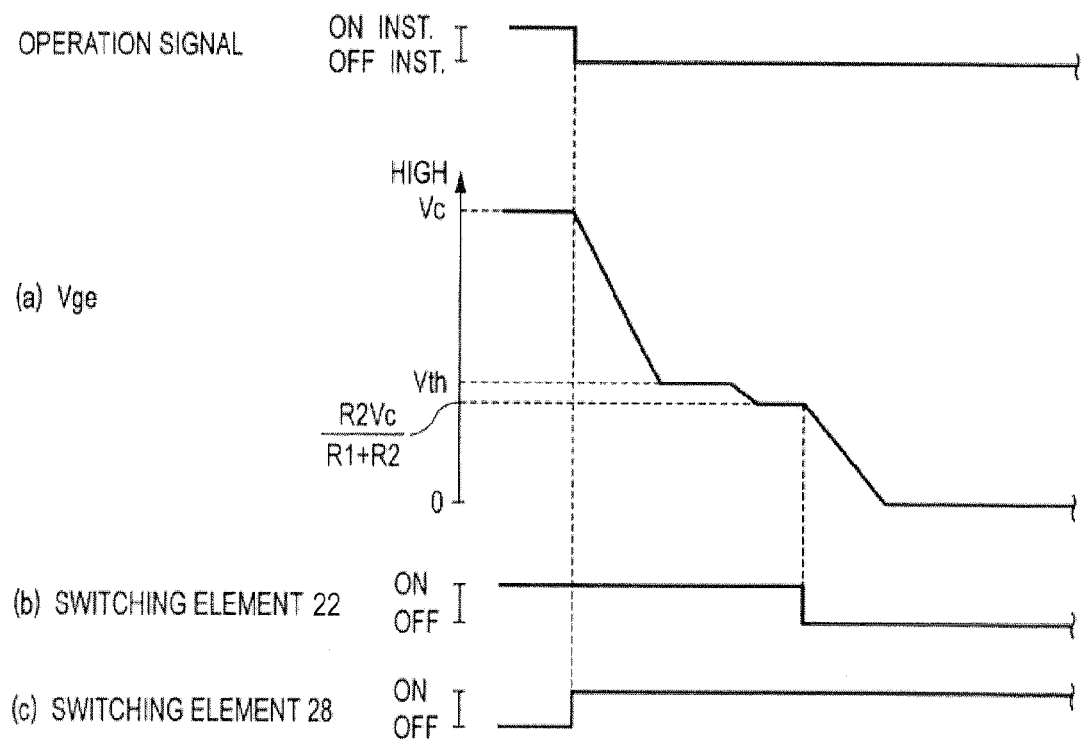
FIG. 18 shows timing charts of a turning-off operation of the power switching element performed by the drive unit DU according to a tenth embodiment of the present invention.

FIG. 18 shows timing charts of the turning-off operation of the switching elements under the control of the drive unit DU as the drive device according to the tenth embodiment.

The timing charts (a), (b), and (c) shown in FIG. 18 correspond to the timing charts (a), (b), and (c) shown in FIG. 4A, respectively.

As shown in the timing charts of FIG. 18, when the operation signal g is switched to the turning-on operation instruction signal, both the first switching element 22 and the second switching elements 28 are turned on, and the gate voltage Vge of the power switching element Sw becomes the divided voltage Vc·R2/(R1+R2) which is obtained by dividing the voltage Vc by the first resistance 24 and the second resistance 26. This makes it possible to decrease the gate voltage Vge of the power switching element Sw and to converge the gate voltage Vge after completion of the mirror time period of the power switching element Sw.

After this, the gate voltage Vge of the power switching element Sw is decreased to zero when the first switching element 22 is turned on and the second switching element 28 is turned off.

(Other Modifications)

The concept of the present invention is not limited by the first to tenth embodiments previously described. For example, it is possible to modify the embodiments previously described as follows.

(Delay Signal Generation Means)

Although the embodiments use the delay signal generation means which inputs and delays the operation signal g, it is possible to use a timer capable of counting the time on the basis of the operation signal g as a trigger signal, and of generating a control signal which indicates the timing when the counted value exceeds a threshold value.

(Switching Means)

Although the embodiments shows the drive unit DU in which the switching means (for example, which is composed mainly of the first switching element and the second switching element) is equipped with the delay circuit 40, it is possible to eliminate the delay circuit 40 from the configuration of the drive unit DU according to the fourth embodiment and the fifth embodiment.

It is also possible to eliminate the delay circuit 40 from the drive unit DU according to the six embodiment. In this case, the detection means can be detect the completion timing at which the mirror time period is elapsed or completed on the basis of the output signal from the comparator 60 when the comparator 60 outputs twice the logical H value after the operation signal g is switched to the turning-on operation instruction signal.

(Excess Current Detection Means)

The present invention is not limited that the excess current detection means detects the occurrence of an excess current flowing in the power switching element Sw by comparing a small current flowing through the sense terminal ST of the power switching element Sw with the voltage drop of the shunt resistance. For example, it is possible to detect the occurrence of the excess current by using a parameter which indicates a correlation between the current flowing in the power switching element Sw and the voltage drop. This voltage drop is generated between the input terminal and the output terminal of the power switching element Sw.

(First Path Connecting the Conductive Control Terminal, Namely, the Gate Terminal with the High Voltage Applying Means)

The embodiments show the first path or a pair of the first paths (such as the first high voltage path and the first low voltage path), the former first path is open and closed by using a single switching element and the latter first path is open and closed by the a pair of the switching elements. However, the present invention is not limited by these configurations. For example, it is possible to use not less than three first paths which are open and closed by using not less than three switching elements.

For example, it is sufficient to supply the voltage of the high voltage supply means to the conductive control terminal, namely, the gate terminal of the power switching element Sw after completion of the mirror time period when the power switching element Sw is switched to the turned-on state by using not less than three paths.

Although the embodiments previously described shows the first path equipped with the resistance and the capacitance as the passive elements, the present invention is not limited by those configurations. It is possible for the first path to have an inductor.

(Second Path Connecting the Conductive Control Terminal. Namely, the Gate Terminal with the Low Voltage Apply Means)

The embodiments show the second path or a pair of the second paths (such as the second high voltage path and the second low voltage path), the former second path is open and closed by using a single switching element and the latter second path is open and closed by the a pair of the switching elements. However, the present invention is not limited by these configurations. For example, it is possible to use not less than three second paths which are open and closed by using not less than three switching elements.

For example, it is sufficient to supply the voltage of the high voltage supply means to the conductive control terminal, namely, the gate terminal of the power switching element Sw after completion of the mirror time period when the power switching element Sw is switched to the turned-on state by using three second paths.

Further, when the drive unit DU has not less than three paths as the first and second paths in order to enter the power switching element Sw into the turned-on state, it is sufficient to supply the voltage of the high voltage power source to the conductive control terminal of the power switching element Sw through these first and second paths before starting the mirror time period. Specifically, in the case shown in the seventh embodiment, it is possible to add an additional high voltage path Lhb and an additional low voltage path Llb which are connected in series, and to activate them connected in series when the operation signal g is switched with the turning-on operation instruction signal. After this, it is possible to use the high voltage path Lha and the low voltage path Lla connected in series. This control makes it possible to further decrease the time period until the mirror time period is started.

The second paths such as the second high voltage path and the second low voltage path are equipped with the resistance and the capacitance as the passive elements. The present invention is not limited by this. For example, it is possible for the second paths to have an inductor.

(Common Parts Between the First and Second Paths)

It is possible to arrange a gate resistance at the common part (such as the common path Lg shown in FIG. 2) between the first path and the second path.

(Switching to Turned-Off State)

The present invention is not limited by the configuration according to the seventh embodiment in which the power switching element Sw enters the turned-off state. For example, it is possible to switch the power switching element Sw to the turned-off state by using the configuration shown in each of the second to ninth embodiments.

(Power Switching Element Sw (Swp, Swn) as the Target Element to be Driven)

The first to tenth embodiments, as previously described, show the IGBT as the switching elements which is driven by the driver unit DU and arranged with the free wheel diode on a same semiconductor substrate on which the IGBT and the free wheel diode are reversely connected in parallel with to each other. The present invention is not limited by this configuration. For example, it is possible to use field effect transistors such as super junction MOS field effect transistors, and MOS field effect transistors made of silicon carbide (SiC). It is also possible to the MOS field effect transistors of n-channel type and p-channel type as the target elements.

The first to tenth embodiments, as previously described, show the power switching elements which form the inverter IV and the converter CV. The present invention is not limited by this configuration. For example, it is possible to use, as the target element, a combination of the power switching element Swp at the high voltage side and the power switching element Swn at the low voltage side connected in series.

While specific embodiments of the present invention have been described in detail, it will be appreciated by those skilled in the art that various modifications and alternatives to those details could be developed in light of the overall teachings of the disclosure. Accordingly, the particular arrangements disclosed are meant to be illustrative only and not limited to the scope of the present invention which is to be given the full breadth of the following claims and all equivalents thereof.

What is claimed is:

1. A drive device for driving a switching element of a voltage controlled type, comprising:
   a first path comprised of a passive element and a first opening/closing means and capable of connecting and disconnecting a conductive control terminal of a switching element to a high voltage supply means;
   a second path comprised of a passive element and a second opening/closing means and capable of connecting the conductive control terminal of the switching element to a low voltage supply means; and
   a switching means for switching a first state to a second state of the first opening/closing means and the second opening/closing means in order to switch a switching state of the switching element, where the first state indicates that both the first opening/closing means and the second opening/closing means are simultaneously turned on, and the second state indicates that one of the first opening/closing means and the second opening/closing means is turned on and the other opening/closing means is turned off, wherein one of the first opening/closing means and the second opening/closing means is capable of connecting one of the high voltage supply means and the second voltage power source to the conductive control terminal of the switching element in order to supply a voltage to the conductive control terminal of the switching element so that the switching element enters the switching state indicated by the switching means; and wherein a converged voltage at the conductive control terminal of the switching element when both the first opening/closing means and the second opening/closing means enter the turned-on state is shifted toward a voltage supplied from one of the high voltage supply means and the low voltage supply means rather than a mirror voltage of the switching element during a mirror time period of the switching element so that the switching element enters the switching state indicated by the switching mean.

2. The drive device according to claim 1, wherein the switching means performs the switching operation when the switching state of the switching element is switched from the turned-off state to the turned-on state, and the converged voltage of the conductive control terminal of the switching element when both the first opening/closing means and the second opening/closing means are turned off is shifted toward a voltage when the switching element is turned on rather than the mirror voltage of the switching element during a mirror time period.

3. The drive device according to claim 2, wherein the switching means performs the switching operation of the switching element after completion of the mirror time period of the switching element.

4. The drive device according to claim 1, further comprising a delay signal generating means for generating a delay signal which indicates a delay time which is delayed from the time for switching the switching state of the switching element indicated by an operation signal, and the switching means performs the switching operation to switch the switching state of the switching element on the basis of the delay signal.

5. The drive device according to claim 4, wherein the delay signal generating means receives the operation signal and generates the delay signal on the basis of the received operation signal.

6. The drive device according to claim 5, wherein the switching means switches the first state to the second state of the first opening/closing means and the second opening/closing means in order to switch the switching state of the switching element from the turned-off state to the turned-on state, where the first state indicates that both the first opening/closing means and the second opening/closing means are simultaneously turned on, and the second state indicates that the first opening/closing means is turned on, and the second opening/closing means is turned off, and the drive device further comprises an excess current detection means for detecting whether or not an excess current flowing in the switching element is excessively increased, wherein the delay signal indicates the delay time when the switching element is switched to the turned-on state, and a delay time period until the delay time indicated by the delay signal is not less than a time period which is necessary for the excess current detection means to detect the excess current flowing in the switching element.

7. The drive device according to claim 6, further comprising an inhibition means for inhibiting the switching operation of the switching means when the excess current detection means detects the occurrence of an excess current flowing in the switching element.

8. The drive device according to claim 4, wherein the delay signal indicates the delay time when the switching element is switched to the turned-on state, and a predicted time period is used as the delay time period until the delay time, where the predicted time period is a time period counted from the time when the switching means instructs the switching element to be turned on to the timing before the completion of the mirror time period of the switching element.

9. The drive device according to claim 4, wherein the delay signal indicates the delay time at which the switching element is switched to the turned-on state, and a predicted time period is used as the delay time period until the delay time, where the predicted time period is a time period counted from the time when the switching element is switched to the turned-on state to the timing when the mirror time period of the switching element is completed.

10. The drive device according to claim 1, wherein the switching means comprises a completion detection means to detect a completion timing of the mirror time period of the switching element, and the switching means performs the switching operation when the completion detection means detects the completion timing of the mirror time period of the switching element.

11. The drive device according to claim 4, wherein the switching means comprises a completion detection means to detect the completion of the mirror time period of the switching element, and the switching means performs the switching operation when the delay time period until the delay time indicated by the delay signal is elapsed and the completion detection means detects the completion of the mirror time period of the switching element.

12. The drive device according to claim 10, wherein the completion detection means comprises a comparison means for comparing the voltage of the conductive control terminal of the switching element with a completion detection voltage, and the switching means uses the comparison result output from the comparison means as the detection result which indicates the completion of the mirror time period of the switching element.

13. The drive device according to claim 12, further comprising a temperature detection means for detecting a temperature of the switching element, and the completion detection means adjusts the completion detection voltage on the basis of the temperature detected by the temperature detection means.

14. The drive device according to claim 10, wherein the completion detection means comprises a voltage-change detection means for detecting a change of the voltage at the conductive control terminal of the switching element, and detects the completion of the mirror time period on the basis of the voltage change detected by the voltage-change detection means.

15. The drive device according to claim 1, wherein the passive element in the first path has a resistance.

16. The drive device according to claim 1, wherein the passive element in the second path has a resistance.

17. The drive device according to claim 16, wherein the passive element in the first path is composed of a resistance, and the passive element in the second path is composed of a resistance.

18. The drive device according to claim 16, wherein the passive element in the first path is composed of a resistance, and the passive element in the second path is composed of a resistance and a capacitance which are connected in parallel with each other.

19. The drive device according to claim 1, wherein the passive element in the first path is composed of a resistance and a capacitance which are connected in parallel with each other, and the passive element in the second path is composed of a resistance and a capacitance which are connected in parallel with each other.

20. The drive device according to claim 19, wherein the switching element is turned on when the high voltage supply means is connected to the conductive control terminal of the switching element, the switching means performs the switching operation when the switching state of the switching element is switched from the turned-off state to the turned-on state, a divided voltage of the voltage between the high voltage supply means and the low voltage supply means divided by the capacitance in the first path and the capacitance in the second path connected in series is lower than the mirror voltage of the switching element, and a divided voltage of the voltage between the high voltage supply means and the low voltage supply means divided by the resistance in the first path and the resistance in the second path connected in series is higher than the mirror voltage of the switching element.

21. The drive device according to claim 1, wherein the switching means performs the switching operation when the switching state of the switching element is switched from the turned-on state to the turned-off state, and the converged voltage at the conductive control terminal of the switching element when the first opening/closing means and the second opening/closing means are turned on is shifted toward the voltage when the switching element is turned off rather than the mirror voltage of the switching element.

22. The drive device according to claim 1, wherein the switching means performs the switching operation after completion of the mirror time period of the switching element.

23. The drive device according to claim 1, wherein the switching element to be driven by the drive device forms a switching element in a power conversion circuit in which a switching element in a high voltage side and a switching element in a low voltage side are connected in series.

* * * * *